United States Patent
Nakamura et al.

(10) Patent No.: US 12,387,309 B2
(45) Date of Patent: Aug. 12, 2025

(54) INSPECTION APPARATUS AND INSPECTION METHOD

(71) Applicant: HAMAMATSU PHOTONICS K.K., Hamamatsu (JP)

(72) Inventors: Tomonori Nakamura, Hamamatsu (JP); Kenichiro Ikemura, Hamamatsu (JP); Akihiro Otaka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 279 days.

(21) Appl. No.: 18/198,983

(22) Filed: May 18, 2023

(65) Prior Publication Data

US 2023/0289950 A1    Sep. 14, 2023

Related U.S. Application Data

(63) Continuation of application No. 17/441,711, filed as application No. PCT/JP2020/003263 on Jan. 29, 2020, now Pat. No. 11,694,324.

(30) Foreign Application Priority Data

Mar. 28, 2019  (JP) ................................. 2019-062968
Nov. 1, 2019  (JP) ................................. 2019-199928

(51) Int. Cl.
*G06T 7/90* (2017.01)
*G01N 21/64* (2006.01)
(Continued)

(52) U.S. Cl.
CPC ....... *G06T 7/0004* (2013.01); *G01N 21/6456* (2013.01); *G06T 7/66* (2017.01);
(Continued)

(58) Field of Classification Search
CPC .......... G06T 7/0004; G06T 7/66; G06T 7/90; G06T 2207/10064; G06T 2207/30148;
(Continued)

(56) References Cited

U.S. PATENT DOCUMENTS 11,475,918 B2   10/2022  Kobayashi et al.
2005/0018332 A1  1/2005  Vizard et al.
(Continued)

FOREIGN PATENT DOCUMENTS

CN    102959385 A    3/2013
CN    107003240 A    8/2017
(Continued)

OTHER PUBLICATIONS

International Preliminary Report on Patentability mailed Oct. 7, 2021 for PCT/JP2020/003263.

*Primary Examiner* — Jamie J Atala
*Assistant Examiner* — Mahmoud Kamal Abouzahra
(74) *Attorney, Agent, or Firm* — Faegre Drinker Biddle & Reath LLP

(57) ABSTRACT

An inspection apparatus is an inspection apparatus includes an excitation light source that generates excitation light to irradiate the object, a dichroic mirror that separates fluorescence from the sample by transmitting or reflecting the fluorescence according to a wavelength, a camera that images fluorescence reflected by the dichroic mirror, a camera that images fluorescence transmitted through the dichroic mirror, and a control apparatus that derives color irregularity information of a light-emitting element based on a first fluorescence image acquired by the camera and a second fluorescence image acquired by the camera, and an edge shift width corresponding to a width of a wavelength band in which transmittance and reflectance change according to a change in wavelength in the dichroic mirror is wider (Continued)

than a full width at half maximum of a normal fluorescence spectrum of the light-emitting element.

18 Claims, 11 Drawing Sheets

(51) Int. Cl.
    *G06T 7/00*     (2017.01)
    *G06T 7/66*     (2017.01)
    *H04N 23/72*     (2023.01)

(52) U.S. Cl.
    CPC ............... *G06T 7/90* (2017.01); *H04N 23/72* (2023.01); *G01N 2021/6417* (2013.01); *G01N 2021/646* (2013.01); *G06T 2207/10064* (2013.01); *G06T 2207/30148* (2013.01)

(58) Field of Classification Search
    CPC ....... G01N 21/6456; G01N 2021/6417; G01N 2021/646; G01N 21/6489; G01N 21/8851; G01N 21/95; G01N 21/956; G01N 2021/6421; G01N 21/6458; G01N 21/314; G01N 21/6428; G01N 21/8806; G01N 2021/8845; G01N 2021/8887; G01N 2201/127; H04N 23/72; H10H 20/01; H10H 20/81; G01J 3/4406
    USPC .......................................................... 348/93
    See application file for complete search history.

(56) References Cited

U.S. PATENT DOCUMENTS

| | | | |
|---|---|---|---|
| 2005/0110999 | A1 | 5/2005 | Erdogan et al. |
| 2005/0286048 | A1* | 12/2005 | Kitagawa ........... G01N 21/6458 356/318 |
| 2011/0042580 | A1* | 2/2011 | Wilson ............... G01N 21/6456 250/200 |
| 2012/0049085 | A1 | 3/2012 | Sappey et al. |
| 2018/0052107 | A1 | 2/2018 | Kim et al. |
| 2020/0011796 | A1 | 1/2020 | Wang et al. |
| 2020/0257100 | A1 | 8/2020 | Putman et al. |
| 2022/0178837 | A1 | 6/2022 | Nakamura |

FOREIGN PATENT DOCUMENTS

| | | |
|---|---|---|
| CN | 109387490 B | 6/2021 |
| CN | 115453807 A | 12/2022 |
| EP | 1275954 A2 | 1/2003 |
| JP | S63-250835 A | 10/1988 |
| JP | 2006-072147 A | 3/2006 |
| JP | 2009-145550 A | 7/2009 |
| JP | 2010-118668 A | 5/2010 |
| JP | 2011-017569 A | 1/2011 |
| JP | 2015-010834 A | 1/2015 |
| JP | 2016-024137 A | 2/2016 |
| JP | 2017-106877 A | 6/2017 |
| JP | 2019-012082 A | 1/2019 |
| TW | 201331568 A | 8/2013 |
| WO | WO 2013/175973 A1 | 11/2013 |
| WO | WO 2014/057998 A1 | 4/2014 |
| WO | WO 2015/111349 A1 | 7/2015 |

* cited by examiner

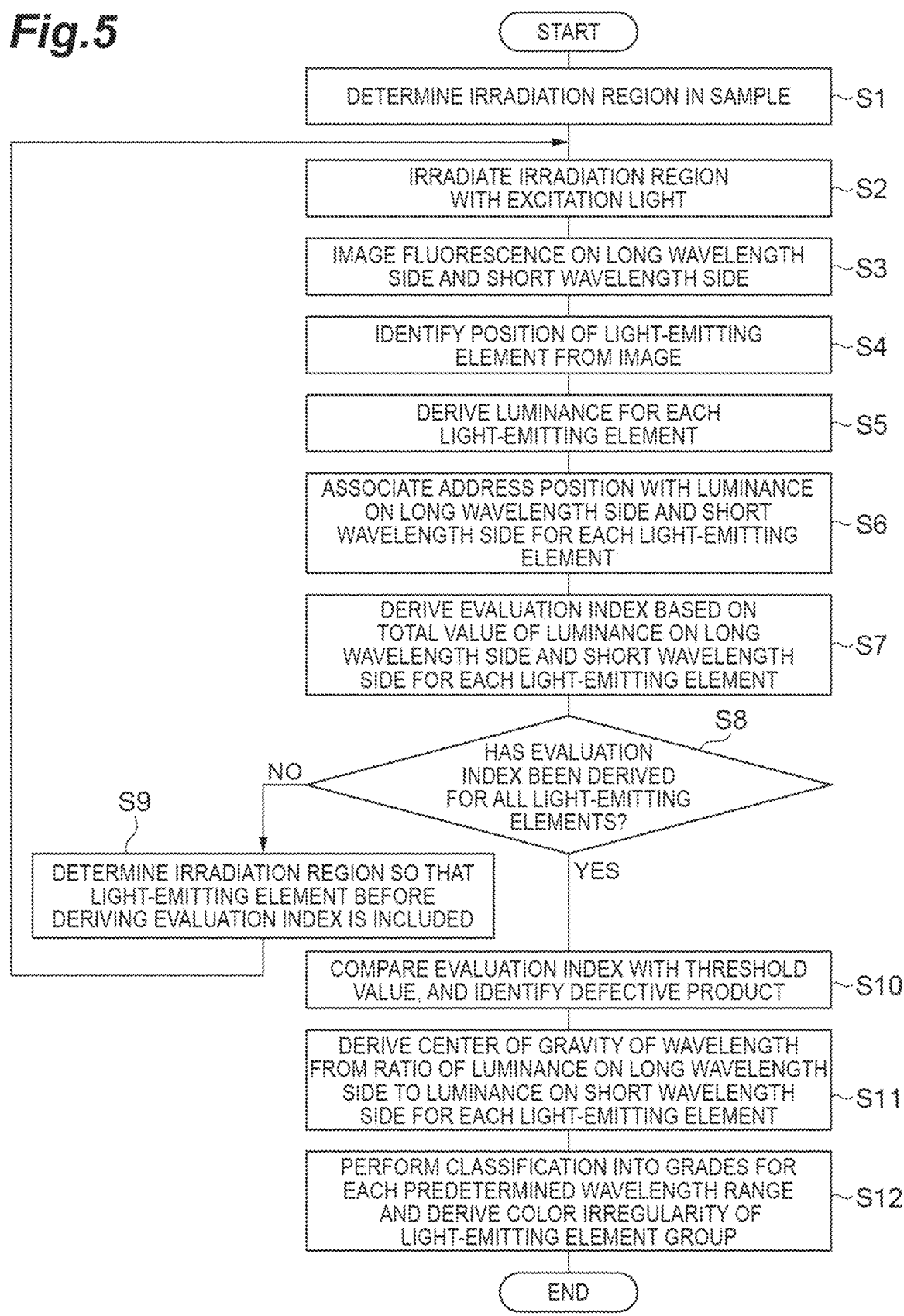

INSPECTION APPARATUS AND INSPECTION METHOD

CROSS-REFERENCE TO RELATED APPLICATIONS

This application is a continuation application of U.S. application Ser. No. 17/441,711, filed Sep. 22, 2021, which is a National Stage Entry of PCT/JP2020/003263, filed Jan. 29, 2020, which claims the benefit of priority to Japanese Patent Application No. 2019-199928, filed Nov. 1, 2019 and Japanese Patent Application No. 2019-062968, filed Mar. 28, 2019, the entire contents of which are incorporated herein by reference.

TECHNICAL FIELD

An aspect of the present invention relates to an inspection apparatus and an inspection method.

BACKGROUND ART

As a method for determining the quality of a light-emitting element group formed on a wafer, there has been a known method of observing the photoluminescence emitted by a light-emitting element and determining the quality of the light-emitting element based on a luminance of the photoluminescence (for example, see Patent Literature 1).

In the method described in Patent Literature 1, photoluminescence (specifically, fluorescence) emitted by the light-emitting element is separated into a long wavelength side and a short wavelength side by an optical element, and respective images are simultaneously measured by two imaging units. According to such a configuration, color irregularity information of the light-emitting element can be derived based on a ratio of luminance values on the long wavelength side and the short wavelength side.

CITATION LIST

Patent Literature

Patent Literature 1: Japanese Unexamined Patent Publication No. 2015-10834

SUMMARY OF INVENTION

Technical Problem

Here, examples of the optical element that separates fluorescence into a long wavelength side and a short wavelength side include a dichroic mirror that reflects light having a specific wavelength and transmits light having other wavelengths. In such an optical element, there is a problem that fluorescence having a narrow wavelength width cannot be appropriately separated. When fluorescence is not appropriately separated according to the wavelength, there is concern that color irregularity of the light-emitting element may not be derived with high accuracy.

One aspect of the invention has been made in view of the above circumstances, and an object of the invention is to derive color irregularity of a light-emitting element with high accuracy by appropriately separating fluorescence according to a wavelength.

Solution to Problem

An inspection apparatus according to an aspect of the invention is an inspection apparatus for inspecting an object in which a plurality of light-emitting elements is formed, the inspection apparatus including an excitation light source that generates excitation light to irradiate the object, an optical element that separates fluorescence from the object by transmitting or reflecting the fluorescence according to a wavelength, a first imaging unit that images fluorescence reflected by the optical element, a second imaging unit that images fluorescence transmitted through the optical element, and a processing unit that derives color irregularity information of a light-emitting element based on a first fluorescence image acquired by the first imaging unit and a second fluorescence image acquired by the second imaging unit, in which an edge shift width is wider than a full width at half maximum of a normal fluorescence spectrum of the light-emitting element, the edge shift width corresponding to a width of a wavelength band in which transmittance and reflectance change according to a change in wavelength.

In the inspection apparatus according to the aspect of the invention, the edge shift width corresponding to the width of the wavelength band in which transmittance and reflectance change according to the change in wavelength in the optical element is wider than the full width at half maximum of the normal fluorescence spectrum of the light-emitting element. For example, when an optical element having a narrow edge shift width is used, it tends to be difficult to appropriately separate fluorescence having a narrow wavelength width. In this regard, it is possible to easily separate the fluorescence according to a wavelength by using an optical element in which an edge shift width is wider than a full width at half maximum of a normal fluorescence spectrum, that is, sufficiently wider than a wavelength width of the fluorescence by considering the wavelength width as in the inspection apparatus according to the aspect of the invention. In this way, it is possible to derive color irregularity information with high accuracy from the first fluorescence image and the second fluorescence image based on each part of the fluorescence separated according to the wavelength.

In the inspection apparatus, the edge shift width of the optical element may be 150 nm or less. When the edge shift width is excessively widened, the resolution of the optical element is lowered, which may affect an original function of the optical element for separating fluorescence into a short wavelength side and a long wavelength side. In this regard, by setting the edge shift width to be wider than the full width at half maximum of the normal fluorescence spectrum and less than or equal to 150 nm, the fluorescence can be easily separated into the short wavelength side and the long wavelength side while dealing with fluorescence having a narrow wavelength width.

In the inspection apparatus, the optical element may be a dichroic mirror. According to such a configuration, fluorescence can be easily separated according to a wavelength.

In the inspection apparatus, the processing unit may derive color irregularity information of the light-emitting element by further considering a change rate of transmittance or reflectance with respect to a change in wavelength in the optical element. The color irregularity information is derived in consideration of, for example, a ratio of the luminance of each separated fluorescent image, etc. When an optical element having a wide edge shift width is used, transmittance and reflectance change according to a change in wavelength, and thus it is conceivable that the luminance ratio of each fluorescent image is different from that when a normal optical element (an optical element having a narrow edge shift width) is used. In this regard, by deriving the color irregularity information in consideration of the change rate of the transmittance or the reflectance with respect to the change of the wavelength in the optical element, the color irregularity information can be derived with high accuracy by removing the influence of using the optical element having the wide edge shift width.

In the inspection apparatus, the processing unit may derive color irregularity information between the plurality of light-emitting elements. As a result, it is possible to output the color irregularity information in units of objects, and to determine, for example, the quality of each light-emitting element.

In the inspection apparatus, the processing unit may derive color irregularity information in each light-emitting element. As a result, it is possible to output the color irregularity information in units of light-emitting elements, and to identify, for example, an abnormal portion, etc. in each light-emitting element.

In the inspection apparatus, the processing unit may correct a wavelength shift according to a position in a field of view of the imaging unit for each pixel of the fluorescence image. The angle of the light incident on the optical element from the object differs depending on the position in the field of view of the imaging unit. Further, a difference in incident angle on the optical element causes a difference (wavelength shift) in the center wavelength of the fluorescence. That is, a difference (wavelength shift) in center wavelength of fluorescence related to each pixel is caused depending on the position in the field of view. In this regard, as described above, by correcting the wavelength shift according to the position in the field of view of the imaging unit, it is possible to suppress the wavelength shift caused by the position in the field of view and to appropriately acquire the original fluorescence related to each pixel.

In the inspection apparatus, the processing unit may correct a wavelength shift for each pixel based on an incident angle of the fluorescence on the optical element for each pixel estimated according to a position in the field of view and an optical characteristic of the optical element with respect to an amount of change in wavelength according to the incident angle of the fluorescence. When the relationship between the position in the field of view and the incident angle on the optical element and the amount of change in wavelength according to the incident angle are identified in advance, the amount of change in wavelength for the pixel can be derived from the position in the field of view. Thus, the wavelength shift can be easily and appropriately corrected for each pixel.

In the inspection apparatus, the processing unit may correct the wavelength shift for each pixel so that a wavelength variance of each pixel in the field of view becomes small. As a result, the variation in the central wavelength of the fluorescence related to each pixel in the field of view is suppressed, and thus the wavelength shift due to the position in the field of view can be appropriately corrected.

The inspection apparatus may further include a spectroscope that decomposes the fluorescence for each wavelength and measures a spectrum, in which the processing unit may identify a first fluorescence intensity, which is an original fluorescence intensity, and a second fluorescence intensity, which is an abnormal fluorescence intensity smaller than the first fluorescence intensity, based on the spectrum in preprocessing performed before deriving the color irregularity information, and determine an illumination luminance of the excitation light applied to the object so that the first fluorescence intensity becomes larger than the second fluorescence intensity by a predetermined value or more, and the excitation light source may generate the excitation light of the illumination luminance determined by the processing unit. The original fluorescence has a larger rate of increase when the illumination luminance of the excitation light becomes higher comparing to the abnormal fluorescence caused by impurities or defects. That is, when the illumination luminance of the excitation light is low, a difference in intensity between the original fluorescence and the abnormal fluorescence is small and there is concern that the original fluorescence may be buried in the abnormal fluorescence. On the other hand, when the illumination luminance of the excitation light is high, the difference in intensity between the original fluorescence and the abnormal fluorescence becomes large, and the original fluorescence is inhibited from being buried in the abnormal fluorescence. As described above, in the preprocessing, when the illumination luminance of the excitation light is determined so that the first fluorescence intensity, which is the original fluorescence intensity, is sufficiently larger than the second fluorescence intensity, which is the abnormal fluorescence intensity, the illumination luminance of the excitation light can be determined so that the original fluorescence is not buried, and the color irregularity information can be accurately derived.

In the inspection apparatus, when the excitation light of the determined illumination luminance is generated by the excitation light source, and fluorescence is imaged by the first imaging unit and the second imaging unit, so that an amount of incident light on at least one of the first imaging unit and the second imaging unit is saturated, the processing unit may insert a filter that limits an amount of light in front of the saturated imaging unit. As a result, it is possible to appropriately prevent the imaging unit from being saturated even when the illumination luminance of the excitation light is increased.

In the inspection apparatus, the excitation light source may generate the excitation light which is pulsed light. By irradiating the pulsed light, both the original fluorescence and the abnormal fluorescence are compared at the peak luminance at all times, and thus it is possible to easily and reliably determine whether the first fluorescence intensity is sufficiently larger than the second fluorescence intensity.

In the inspection apparatus, when the excitation light of the determined illumination luminance is generated by the excitation light source and fluorescence is imaged by the first imaging unit and the second imaging unit, so that an amount of incident light on at least one of the first imaging unit and the second imaging unit is saturated, the processing unit may suppress the amount of incident light by adjusting a duty ratio of the pulsed light. The imaging unit can be saturated by the amount of incident light, that is, the intensity of fluorescence×time, and thus by changing the duty ratio of the pulsed light to adjust the incident time of the fluorescence, saturation of the imaging unit can be appropriately suppressed without changing the fluorescence intensity (ratio of original fluorescence to abnormal fluorescence).

In the inspection apparatus, the excitation light source may synchronize a frequency of the pulsed light with an integral multiple of a reciprocal of an exposure time of the first imaging unit and the second imaging unit. As a result, the number of rays of the pulsed light included in each exposure time can be made the same, and it is possible to prevent the amount of incident light of the fluorescence from being different between exposure times.

In the inspection apparatus, the processing unit may derive a luminance of each light-emitting element and a center of gravity of a fluorescence wavelength based on the first fluorescence image and the second fluorescence image, and determine that a light-emitting element having a luminance at which a variation in the center of gravity of the fluorescence wavelength becomes larger than a predetermined value is a defective product and a light-emitting element having a luminance at which the variation in the center of gravity of the fluorescence wavelength becomes less than or equal to the predetermined value is a non-defective product. The center of gravity (center wavelength) of the fluorescence wavelength tends to fluctuate (tends to vary) in a luminance band of a defective product. Therefore, by determining that a light-emitting element having a luminance (luminance band) at which the variation in the center of gravity of the fluorescence wavelength is larger than the predetermined value is a defective product, it is possible to highly accurately and easily determine whether a product is defective/non-defective.

The inspection apparatus may further include a holding member that holds the object, in which the holding member may have a temperature control function. When the holding member that holds the object has the temperature control function, it is possible to prevent the temperature of the object from drifting due to the illumination and the fluorescence wavelength from drifting accordingly.

The inspection apparatus may further include a holding member that holds the object, in which the holding member may suck exclusively a peripheral portion of the object. When the holding member sucks only the peripheral portion of the object, the object is held with a central part of the object floating (not in contact with the holding member), and it is possible to more appropriately suppress the wavelength shift due to the temperature change of the object.

In the inspection apparatus, the processing unit may change shading of the fluorescence image each time the object and the illumination luminance of the excitation light are changed. As a result, appropriate shading can be applied according to the object and the illumination luminance.

In the inspection apparatus, the excitation light source may switch the illumination luminance of the excitation light a plurality of times. By acquiring data at a different illumination luminance, the quality can be more accurately determined.

An inspection method according to an aspect of the invention is an inspection method for irradiating an object in which a plurality of light-emitting elements is formed with excitation light, and deriving color irregularity information of a light-emitting element based on a first fluorescence image acquired by imaging fluorescence reflected by an optical element that separates fluorescence from the object by transmitting or reflecting the fluorescence according to a wavelength and a second fluorescence image acquired by imaging fluorescence transmitted through the optical element, the method including a process of separating the fluorescence for each wavelength and measuring a spectrum, a process of identifying a first fluorescence intensity, which is an original fluorescence intensity, and a second fluorescence intensity, which is an abnormal fluorescence intensity smaller than the first fluorescence intensity, based on the spectrum, a process of determining an illumination luminance of the excitation light applied to the object so that the first fluorescence intensity becomes larger than the second fluorescence intensity by a predetermined value or more, and a process of generating the excitation light of the determined illumination luminance.

The inspection method may further include a process of inserting a filter that limits an amount of light in front of an imaging unit acquiring the fluorescence image when an amount of incident light on the imaging unit is saturated by irradiating the object with the excitation light of the determined illumination luminance.

The inspection method may further include a process of suppressing an amount of incident light on an imaging unit acquiring the fluorescence image by adjusting a duty ratio of the excitation light which is pulsed light when the amount of incident light is saturated by irradiating the object with the excitation light of the determined illumination luminance.

Advantageous Effects of Invention

According to an inspection apparatus and an inspection method according to an aspect of the invention, it is possible to derive color irregularity of a light-emitting element with high accuracy by appropriately separating fluorescence according to a wavelength.

BRIEF DESCRIPTION OF DRAWINGS

FIG. 5 is a flowchart of an inspection method executed by the inspection apparatus.

DESCRIPTION OF EMBODIMENTS

Hereinafter, an embodiment of the invention will be described in detail with reference to the drawings. Note that in each figure, the same reference symbols are assigned to the same or corresponding parts, and duplicate description will be omitted.

Figure 1:
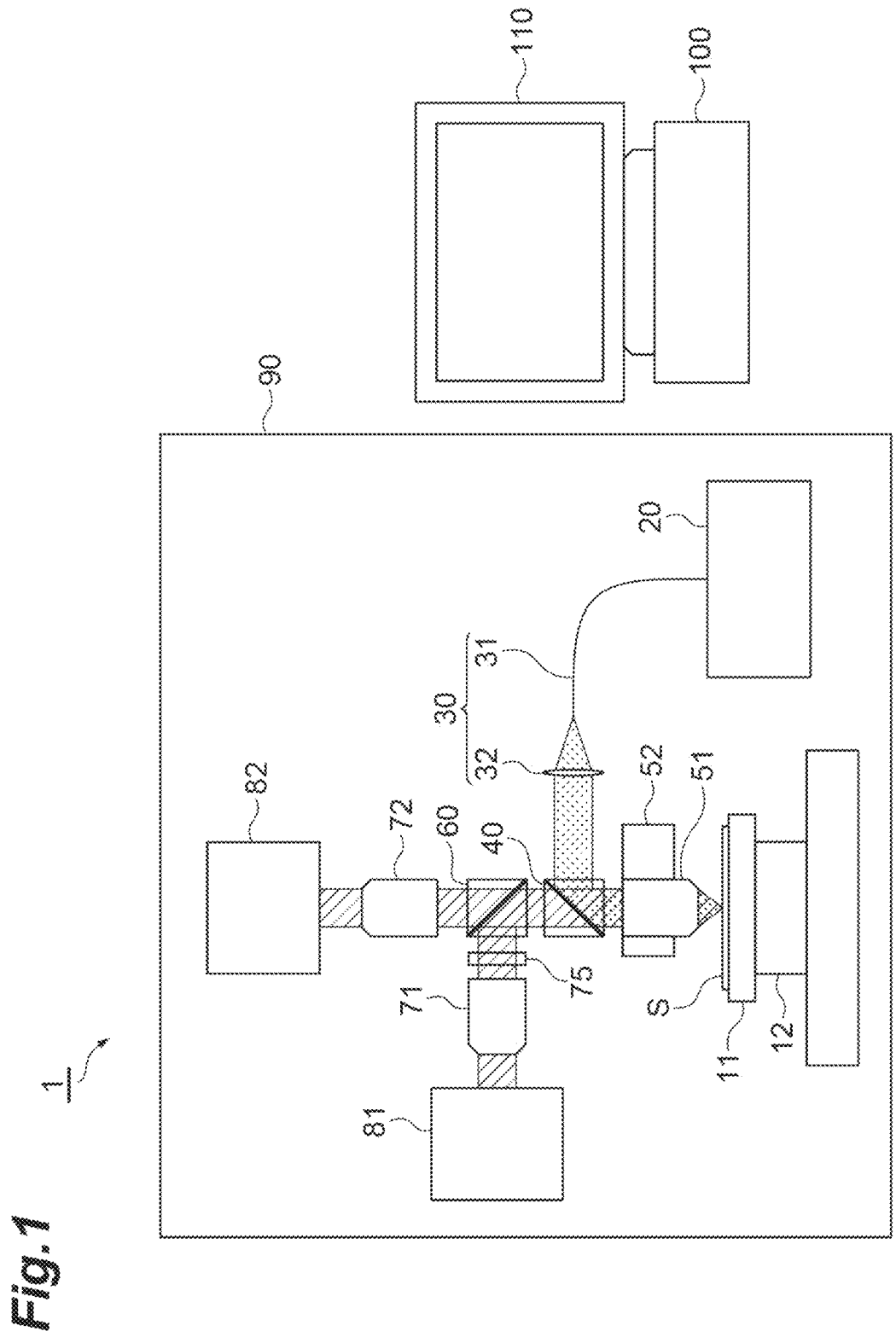
FIG. 1 is a configuration diagram of an inspection apparatus according to an embodiment of the invention.

FIG. 1 is a configuration diagram of an inspection apparatus 1 according to the present embodiment. The inspection apparatus 1 is a apparatus that inspects a sample S (object). For example, the sample S is a semiconductor apparatus in which a plurality of light-emitting elements is formed on a wafer. The light-emitting element is, for example, an LED, a mini LED, a μLED, an SLD element, a laser element, a vertical laser element (VCSEL), etc. The inspection apparatus 1 derives color irregularity information between a plurality of light-emitting elements (details will be described later) and determines the quality of each light-emitting element by observing photoluminescence (specifically, fluorescence) of the plurality of light-emitting elements formed in the sample S. Note that, for example, it is possible to consider inspecting the light-emitting element by probing (that is, based on an electrical characteristic). However, for a fine LED such as a µLED, probing for performing measurement by applying a needle is physically difficult. In this regard, in the method for inspecting the light-emitting element based on photoluminescence according to the present embodiment, inspection can be performed by acquiring a fluorescence image, so that a large number of light-emitting elements can be efficiently inspected without being bound by physical restrictions.

As illustrated in FIG. 1, the inspection apparatus 1 includes a chuck 11, an XY stage 12, an excitation light source 20, an optical system 30, a dichroic mirror 40, an objective lens 51, a Z stage 52, a dichroic mirror 60 (optical element), imaging lenses 71 and 72, a band-pass filter 75, cameras 81 (first imaging unit) and 82 (second imaging unit), a dark box 90, a control apparatus 100 (processing unit), and a monitor 110. The dark box 90 accommodates components other than the control apparatus 100 and the monitor 110 among the components described above, and is provided to prevent an influence of external light on each of the accommodated components. Note that the respective components accommodated in the dark box 90 may be mounted on a vibration isolation table to improve the quality of images captured by the cameras 81 and 82 (improve the image quality and prevent image misalignment).

The chuck 11 is a holding member that holds the sample S. The chuck 11 holds the sample S by, for example, vacuum-sucking the wafer of the sample S. The XY stage 12 is a stage for moving the chuck 11 holding the sample S in an XY direction (front-back and right-left directions), that is, in a direction along a mounting surface of the sample S on the chuck 11. The XY stage 12 moves the chuck 11 in the XY direction so that each of the plurality of light-emitting elements is sequentially set as an irradiation region of excitation light according to control of the control apparatus 100. Note that the inspection apparatus 1 may further include a rotating stage (Θ stage, not illustrated). Such a rotating stage may be provided, for example, above the XY stage 12 and below the chuck 11, or may be provided integrally with the XY stage 12. The rotating stage is used to accurately align vertical and horizontal positions of the sample S. By providing the rotating stage, it is possible to shorten a time for alignment, etc. and to shorten a total time for data processing.

The excitation light source 20 is a light source that generates excitation light to irradiate the sample S and irradiates the sample S with excitation light. The excitation light source 20 may be a light source capable of generating light including a wavelength that excites the light-emitting element of the sample S, and is, for example, an LED, a laser, a halogen lamp, a mercury lamp, a D2 lamp, a plasma light source, etc. Note that the inspection apparatus 1 may further include a sensor that monitors the illumination luminance to keep a luminance of excitation light emitted from the excitation light source 20 constant. Further, in order to reduce shading as much as possible, a luminance distribution may be made uniform by using a diffuser plate, a fly-eye lens, etc. at a position where excitation light is emitted from the excitation light source 20.

The optical system 30 includes an optical fiber cable 31 and a light guide lens 32. The optical fiber cable 31 is an optical fiber cable for guiding light connected to the excitation light source 20. As the optical fiber cable 31, for example, a polarization preservation fiber, a single mode fiber, etc. can be used. The light guide lens 32 is, for example, a single or composite convex lens, and guides excitation light arriving through the optical fiber cable 31 in a direction of the dichroic mirror 40. Note that, to prevent a wavelength of excitation light emitted from the excitation light source 20 from changing over time, the inspection apparatus 1 may include a band-pass filter (not illustrated) between the excitation light source 20 and the dichroic mirror 40.

Figure 2:
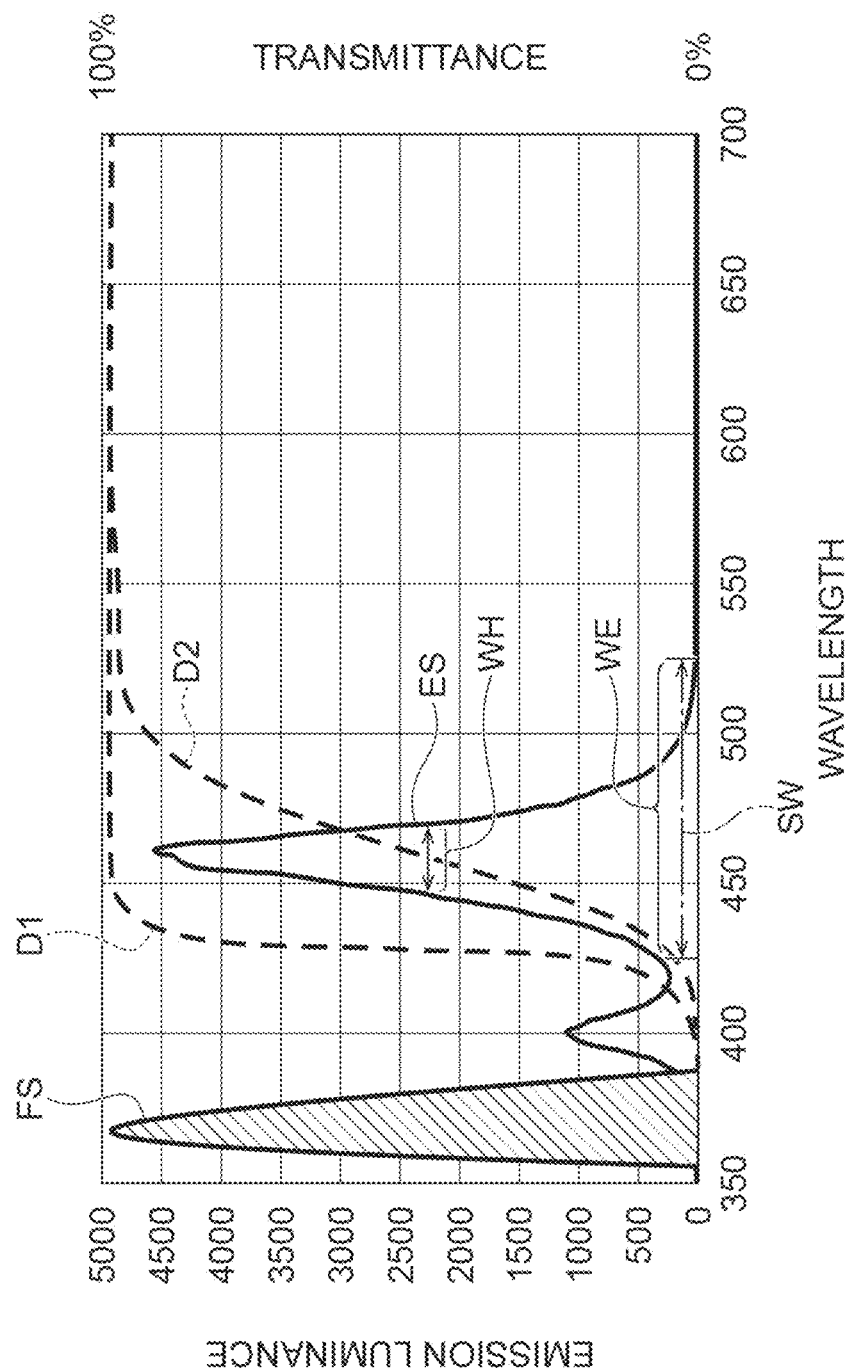
FIG. 2 is a diagram for description of an emission spectrum and characteristics of dichroic mirrors.

The dichroic mirror 40 is a mirror made of a special optical material, and reflects light of a specific wavelength and transmits light of other wavelengths. Specifically, the dichroic mirror 40 is configured to reflect excitation light in a direction of the objective lens 51 and transmit photoluminescence (specifically, fluorescence) from the light-emitting element, which is light in a wavelength band different from that of excitation light, in a direction of the dichroic mirror 60. Note that, as shown in FIG. 2, a region of a normal emission spectrum FS of excitation light is on a lower wavelength side of a region of a normal emission spectrum (normal fluorescence spectrum) ES of fluorescence. That is, the dichroic mirror 40 reflects excitation light, which is light in a low wavelength band, in the direction of the objective lens 51, and transmits fluorescence, which is light in a higher wavelength band than that of excitation light, in the direction of the dichroic mirror 60, which is clear from a characteristic D1 of the dichroic mirror 40 shown in FIG. 2.

The objective lens 51 has a configuration for observing the sample S, and concentrates excitation light guided by the dichroic mirror 40 on the sample S. The Z stage 52 adjusts the focus by moving the objective lens 51 in a Z direction (vertical direction), that is, in a direction intersecting the mounting surface of the sample S on the chuck 11.

The dichroic mirror 60 is a mirror made of a special optical material, and reflects light of a specific wavelength and transmits light of other wavelengths. That is, the dichroic mirror 60 is an optical element that separates fluorescence from the sample S by transmitting or reflecting the fluorescence according to the wavelength.

FIG. 2 is a diagram for description of an emission spectrum and characteristics of the dichroic mirrors 60 and 40. In FIG. 2, a horizontal axis represents a wavelength, a left vertical axis represents emission luminance, and a right vertical axis represents transmittance. As illustrated in a characteristic D2 of the dichroic mirror 60 of FIG. 2, in the dichroic mirror 60, in a specific wavelength band SW, transmittance (and reflectance) of fluorescence changes according to a change in wavelength, and in a wavelength band other than the specific wavelength band SW (that is, a lower wavelength side of the wavelength band SW and a higher wavelength side of the wavelength band SW), transmittance (and reflectance) of fluorescence is constant regardless of a change in wavelength. There is a negative correlation between the transmittance and the reflectance in which when one changes in a direction of increasing, the other changes in a direction of decreasing. Thus, in the following, "transmittance (and reflectance)" may be simply described as "transmittance". Note that "transmittance of fluorescence is constant regardless of a change in wavelength" means not only a case where transmittance is completely constant but also, for example, a case where a change in wavelength with respect to a change in wavelength of 1 nm is 0.1% or less. On the lower wavelength side of the wavelength band SW, the fluorescence transmittance is approximately 0% regardless of the wavelength change, and on the higher wavelength side of the wavelength band SW, the fluorescence transmittance is approximately 100% regardless of the wavelength change. Note that "the fluorescence transmittance is approximately 0%" means that the transmittance of about 0%+10% is included, and "the fluorescence transmittance is approximately 100%" means that the transmittance of about 100%-10% is included. Further, in the following, the width of the wavelength band SW in which the fluorescence transmittance changes according to the wavelength change may be described as "edge shift width WE".

As shown in FIG. 2, the edge shift width WE of the dichroic mirror 60 is at least wider than a full width at half maximum WH of a normal fluorescence spectrum ES of the light-emitting element. The full width at half maximum WH is, for example, about 10 nm. That is, the edge shift width WE is wider than, for example, 10 nm. In an example shown in FIG. 2, the wavelength band SW is a wavelength band of approximately 425 mm to 525 mm, and the edge shift width WE is about 100 nm, which is sufficiently wider than the full width at half maximum WH of the normal fluorescence spectrum ES. The edge shift width WE is set to, for example, 150 nm or less. The wavelength band SW generally includes the wavelength band of the normal fluorescence spectrum ES. In this way, the fluorescence from the sample S is appropriately separated by the dichroic mirror 60. Note that the wavelength band of the normal fluorescence spectrum ES (original emission wavelength) may be, for example, a wavelength known in advance from a specification of the light-emitting element, or may be a wavelength corresponding to a peak of intensity obtained by measuring fluorescence from the light-emitting element by a spectroscope.

As is clear from the characteristic D2 of the dichroic mirror 60 shown in FIG. 2, the dichroic mirror 60 reflects almost all the fluorescence on the lower wavelength side of the wavelength band SW, transmits almost all the fluorescence on the higher wavelength side of the wavelength band SW, and transmits fluorescence in the wavelength band SW at a transmittance according to a wavelength (reflects fluorescence in the wavelength band SW at a reflectance according to a wavelength). Fluorescence reflected by the dichroic mirror 60 (fluorescence on the short wavelength side) reaches the imaging lens 71 via the band-pass filter 75. Fluorescence transmitted through the dichroic mirror 60 (fluorescence on the long wavelength side) reaches the imaging lens 72.

The imaging lens 71 is a lens that forms an image of fluorescence reflected by the dichroic mirror 60 (fluorescence on the short wavelength side) and guides the fluorescence to the camera 81. The camera 81 images fluorescence reflected by the dichroic mirror 60 (fluorescence on the short wavelength side) in fluorescence from the light-emitting element. The camera 81 images the fluorescence on the short wavelength side by detecting the image formed by the imaging lens 71. The camera 81 outputs a fluorescence image (first fluorescence image) on the short wavelength side, which is an imaging result, to the control apparatus 100. The camera 81 is, for example, an area image sensor such as a CCD or MOS. Further, the camera 81 may include a line sensor or a time delay integration (TDI) sensor. The band-pass filter 75 is a filter provided to prevent mixing of excitation light, and is provided between the dichroic mirror 60 and the imaging lens 71. Note that the inspection apparatus 1 may further include a band-pass filter between the dichroic mirror 60 and the camera 81 to prevent fluorescence on the long wavelength side from being mixed due to surface reflection of the dichroic mirror 60 when measuring fluorescence on the short wavelength side.

The imaging lens 72 is a lens that forms an image of fluorescence transmitted through the dichroic mirror 60 (fluorescence on the long wavelength side) and guides the fluorescence to the camera 82. The camera 82 images the fluorescence transmitting the dichroic mirror 60 (fluorescence on the long wavelength side) in the fluorescence from the light-emitting element. The camera 82 images the fluorescence on the long wavelength side by detecting the image formed by the imaging lens 72. The camera 82 outputs a fluorescence image (second fluorescence image) on the long wavelength side, which is an imaging result, to the control apparatus 100. The camera 82 is, for example, an area image sensor such as a CCD or MOS. Further, the camera 82 may include a line sensor or a TDI sensor. Note that the inspection apparatus 1 may further include a band-pass filter between the dichroic mirror 60 and the camera 82 to prevent unnecessary light emission on the long wavelength side.

The control apparatus 100 controls the XY stage 12, the excitation light source 20, the Z stage 52, and the cameras 81 and 82. Specifically, the control apparatus 100 adjusts an irradiation region of excitation light (irradiation region in the sample S) by controlling the XY stage 12. The control apparatus 100 adjusts the focus related to excitation light by controlling the Z stage 52. The control apparatus 100 adjusts emission of excitation light and adjusts a wavelength, amplitude, etc. of excitation light by controlling the excitation light source 20. The control apparatus 100 performs adjustment related to acquisition of a fluorescence image by controlling the cameras 81 and 82. Further, the control apparatus 100 derives color irregularity information of the light-emitting element of the sample S based on fluorescence images captured by the cameras 81 and 82 (details will be described later). Note that the control apparatus 100 is a computer, and is physically configured to include a memory such as a RAM or a ROM, a processor (arithmetic circuit) such as a CPU, a communication interface, and a storage unit such as a hard disk. Examples of the control apparatus 100 include a personal computer, a cloud server, and a smart apparatus (smartphone, tablet terminal, etc.). The control apparatus 100 functions by executing a program stored in a memory on a CPU of a computer system. The monitor 110 is a display apparatus that displays a fluorescence image which is a measurement result.

Next, a detailed description will be given of a function of the control apparatus 100 related to derivation of the color irregularity information of the light-emitting element.

The control apparatus 100 derives the color irregularity information of the light-emitting element based on a fluorescence image (fluorescence image on the short wavelength side) acquired by the camera 81 and a fluorescence image (fluorescence image on the long wavelength side) acquired by the camera 82.

Figure 3:
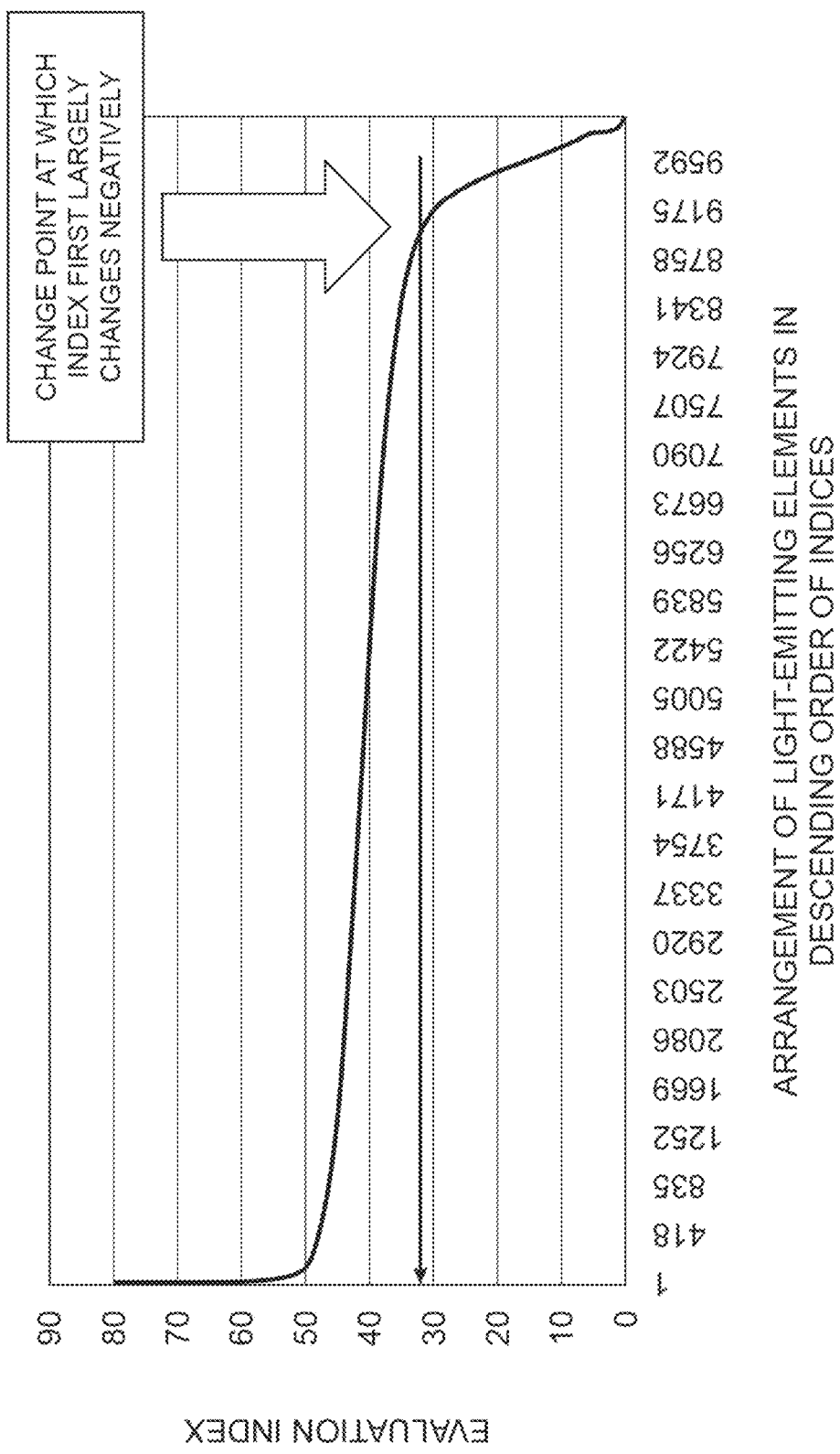
FIG. 3 is a diagram showing a sorting result for each light-emitting element according to an evaluation index.

The control apparatus 100 first identifies a position of the light-emitting element based on a fluorescence image, and identifies a light-emitting area of each light-emitting element. The position of the light-emitting element is identified, for example, by conversion between a position in the fluorescence image and a position of the XY stage 12. Note that the control apparatus 100 may acquire a pattern image of the entire sample S in advance and recognize (identify) the position of the light-emitting element from the pattern image or the fluorescence image. Then, the control apparatus 100 derives an average luminance in the light-emitting area of each light-emitting element based on the fluorescence image on the short wavelength side, derives an average luminance in the light-emitting area of each light-emitting element based on the fluorescence image on the long wavelength side, and associates an address position with a luminance (average luminance on the short wavelength side and average luminance on the long wavelength side) for each light-emitting element. The control apparatus 100 derives a total value of the luminance on the short wavelength side and the luminance on the long wavelength side for each address (each light-emitting element), and derives an evaluation index from an absolute luminance and a relative luminance of the total value. The relative luminance is a ratio of a luminance of a light-emitting element to be derived to an average luminance of a light-emitting element group including the light-emitting element to be derived and light-emitting elements around the light-emitting element. The control apparatus 100 derives the evaluation index from, for example, the product of the absolute luminance and the relative luminance. Alternatively, the control apparatus 100 derives the evaluation index from the product of the absolute luminance and the relative luminance to the nth power (n is a natural number, for example, 2). The control apparatus 100 derives the above-mentioned evaluation index for each of the light-emitting elements included in the same fluorescence image. Further, the control apparatus 100 acquires a new fluorescence image (fluorescence image on the short wavelength side and fluorescence image on the long wavelength side) by changing the irradiation region, and derives an evaluation index for each light-emitting element included in the fluorescence image. When the control apparatus 100 derives the evaluation indices for all the light-emitting elements, the control apparatus 100 sorts (rearranges) the light-emitting elements in descending order of the evaluation indices. FIG. 3 is a diagram showing a sorting result for the light-emitting elements according to the evaluation indices. In FIG. 3, a vertical axis represents an evaluation index according to the magnitude of the luminance, and a horizontal axis represents the order of the respective light-emitting elements. As shown in FIG. 3, the evaluation index sharply decreases after a certain point (change point). For example, using such a change point as a threshold value, the control apparatus 100 may determine that a light-emitting element having an evaluation index smaller than the threshold value is a defective product (defective pixel). Note that, for example, using a reference semiconductor apparatus for determining the threshold value in advance, the threshold value may be determined by comparing a quality determination result for a light-emitting element based on fluorescence (photoluminescence) with a quality determination result based on probing (quality determination result based on an electrical characteristic).

Further, the control apparatus 100 derives the center of gravity (center wavelength) of the fluorescence wavelength from a ratio of the luminance on the short wavelength side to the luminance on the long wavelength side for each light-emitting element. The control apparatus 100 may determine whether or not the center wavelength is within a specified wavelength range (for example, within a range of 440 nm to 460 nm), and determine that a light-emitting element that is not within the specified wavelength range is a defective product (defective pixel). The control apparatus 100 classifies each light-emitting element into grades for each predetermined range of the center wavelength, and derives color irregularity among a plurality of light-emitting elements based on the grades.

Here, as described above, in the dichroic mirror 60 according to the present embodiment, as shown in FIG. 2, the edge shift width WE of the wavelength band SW in which the transmittance and the reflectance of the fluorescence change according to the change in wavelength is sufficiently wide (specifically, wider than the full width at half maximum WH of the normal fluorescence spectrum ES). When such a dichroic mirror 60 is used, the center wavelength based on the luminance on the short wavelength side and the luminance on the long wavelength side is derived with a shift from an original value according to a change rate in the transmittance (or reflectance) with respect to the change in wavelength in the dichroic mirror 60. A process for correcting such a shift of the center wavelength will be described with reference to FIGS. 4A and 4B.

Figure 4A:
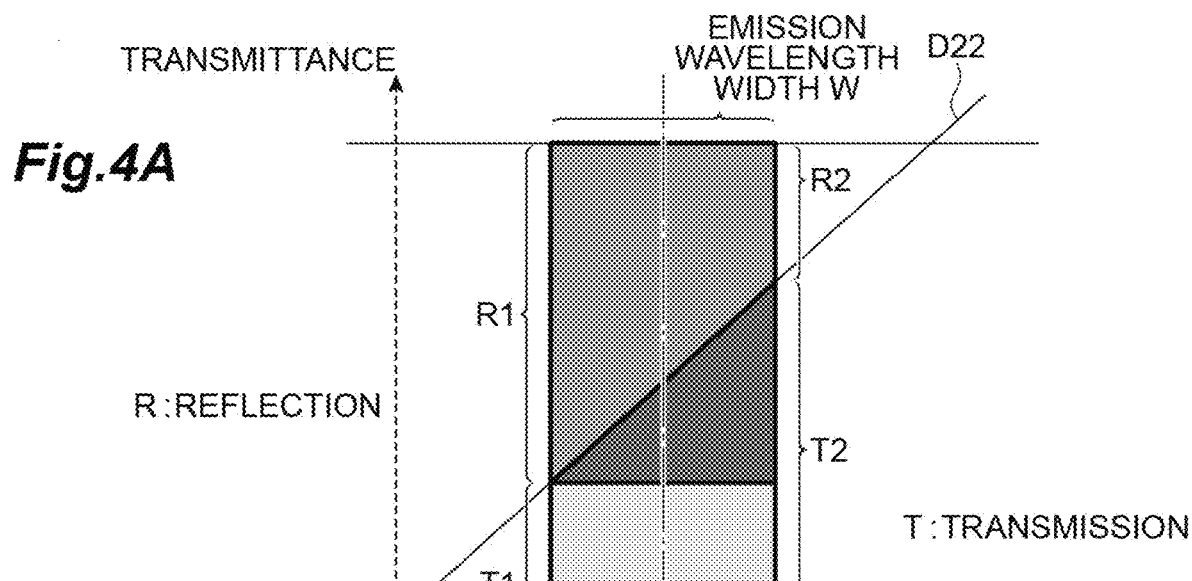
FIGS. 4A and 4B are diagrams for description of shift correction of a center wavelength.
Figure 4B:
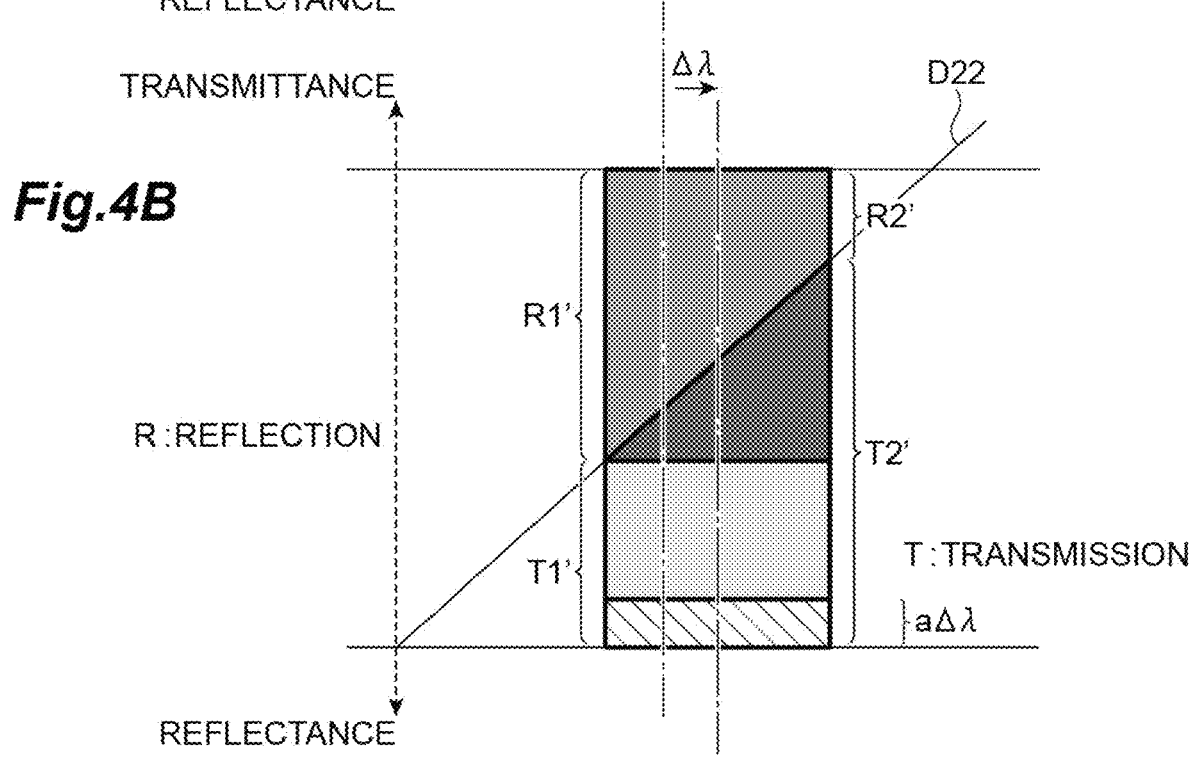

FIGS. 4A and 4B are diagrams for description of shift correction of a center wavelength. In FIGS. 4A and 4B, a horizontal axis represents a wavelength and a vertical axis represents transmittance (and reflectance). Further, FIGS. 4A and 4B illustrate a characteristic D22 of the dichroic mirror in which the transmittance (transmitted light amount) changes at a rate of a %/nm. Now, assuming that a wavelength at which the reflectance of the dichroic mirror is 50% is A (50%) nm, as shown in FIG. 4A, when a center of an emission wavelength having a rectangular distribution is λ (50%), the light amount of reflected light (reflected light amount) R becomes equal to the light amount of transmitted light (transmitted light amount) T. Further, as shown in FIG. 4A, when the transmitted light amount at a lowest wavelength in a rectangular emission wavelength is set to T1, the reflected light amount at the lowest wavelength is set to R1, the transmitted light amount at a highest wavelength is set to T2, the reflected light amount at the highest wavelength is set to R2, an emission wavelength width is set to W, and a wavelength shift parameter is set to S, the following Equations (1) to (4) hold. Note that the wavelength shift parameter can be rephrased as "a value obtained by dividing a difference between the transmitted light amount and the reflected light amount by the total amount of light".

$$\text{Amount of luminescence } L = R + T \tag{1}$$

$$\text{Reflected light amount } R = (R1 + R2) * W/2 \tag{2}$$

$$\text{Transmitted light amount } T = (T1 + T2) * W/2 \tag{3}$$

$$\text{Wavelength shift parameter } S = (T - R)/(T + R) = 0 \tag{4}$$

FIG. 4B shows a state in which the center wavelength derived under the condition of FIG. 4A is shifted by Δλ. As shown in FIG. 4B, when the emission wavelength is shifted by Δλ, the transmitted light amount increases by aΔλ in the entire range of the emission wavelength. In this case, when the transmitted light amount at a lowest wavelength in the emission wavelength is set to T1', the reflected light amount at the lowest wavelength is set to R1', the transmitted light amount at a highest wavelength is set to T2', the reflected light amount at the highest wavelength is set to R2', and a wavelength shift parameter is set to S', the following Equations (5) to (12) hold.

$$R1' = R1 - a\Delta\lambda \tag{5}$$

$$R2' = R2 - a\Delta\lambda \tag{6}$$

$$T1' = T1 + a\Delta\lambda \tag{7}$$

$$T2' = T2 + a\Delta\lambda \tag{8}$$

$$\text{Reflected light amount } R' = (R1' + R2') * W/2 = R - aW\Delta\lambda \tag{9}$$

$$\text{Transmitted light amount } T' = (T1' + T2') * W/2 = T + aW\Delta\lambda \tag{10}$$

$$\text{Wavelength shift parameter } S' = (T' - R')/(T' + R') = 2aW\Delta\lambda/L \tag{11}$$

Here, the following Equation (12) holds from the above Equations (1) to (3).

$$L/W = R1 + T1 = 100\% = 1 \tag{12}$$

From Equations (11) and (12), $$S' = 2a\Delta\lambda/(100\%) = 2a\Delta\lambda \tag{13}$$

From Equation (13), $$\Delta\lambda = S'/2a \tag{14}$$

As shown in the above Equation (14), Δλ, which is the shift amount of the center wavelength, is equal to a value obtained by dividing a value S', which is obtained by dividing the difference between the transmitted light amount and the reflected light amount by the total amount of light, by twice the change amount "a" of the transmittance (transmitted light amount). From this fact, the control apparatus 100 may derive Δλ, which is the shift amount of the center wavelength, further considering a change rate of the transmittance or the reflectance with respect to the change of the wavelength in the dichroic mirror 60, specifically using the above Equation (14), and derive a precise center wavelength for each light-emitting element by correcting (subtracting) the shift amount Δλ with respect to the previously derived center wavelength.

Next, a description will be given of a processing procedure of the inspection method (derivation of the color irregularity information of the light-emitting element) executed by the inspection apparatus 1 with reference to FIG. 5. FIG. 5 is a flowchart of the inspection method executed by the inspection apparatus 1.

As illustrated in FIG. 5, in the inspection apparatus 1, the irradiation region in the sample S is first determined (step S1). Specifically, the control apparatus 100 determines the irradiation region for excitation light by controlling the XY stage 12.

Subsequently, the excitation light source 20 irradiates the irradiation region of the sample S with excitation light according to the control of the control apparatus 100 (step S2). The excitation light source 20 generates and emits light including a wavelength that excites the light-emitting element of the sample S. The excitation light reaches the dichroic mirror 40 via the optical fiber cable 31 and the light guide lens 32 of the optical system 30, is reflected by the dichroic mirror 40, and is concentrated on the irradiation region of the sample S via the objective lens 51. The light-emitting element of sample S emits fluorescence in response to excitation light. The fluorescence passes through the dichroic mirror 40 and is separated into fluorescence on the short wavelength side and fluorescence on the long wavelength side in the dichroic mirror 60. The fluorescence on the short wavelength side forms an image by the imaging lens 71 and is guided to the camera 81. The fluorescence on the long wavelength side forms an image by the imaging lens 72 and is guided to the camera 82.

The camera 81 images the fluorescence on the short wavelength side (step S3). Further, the camera 82 images the fluorescence on the long wavelength side (step S3). The cameras 81 and 82 output fluorescence images, which are imaging results, to the control apparatus 100.

Subsequently, the control apparatus 100 identifies a position of the light-emitting element based on the fluorescence image (step S4), and identifies a light-emitting area in each light-emitting element. Then, the control apparatus 100 derives the luminance (average luminance) in the light-emitting area of each light-emitting element based on the fluorescence image on the short wavelength side, and derives the luminance (average luminance) in the light-emitting area of each light-emitting element based on the fluorescence image on the long wavelength side (step S5). Then, the control apparatus 100 associates the address position with the luminance (average luminance on the short wavelength side and average luminance on the long wavelength side) for each light-emitting element (step S6).

Subsequently, the control apparatus 100 derives a total value of the luminance on the short wavelength side and the luminance on the long wavelength side for each light-emitting element, and derives an evaluation index from an absolute luminance and a relative luminance of the total value (step S7). The control apparatus 100 derives an evaluation index from, for example, the product of the absolute luminance and the relative luminance. Alternatively, the control apparatus 100 derives an evaluation index from the product of the absolute luminance and the relative luminance to the nth power (n is a natural number, for example, 2).

Subsequently, the control apparatus 100 determines whether or not the above-mentioned evaluation index has been derived for all the light-emitting elements (light-emitting elements to be determined) of the sample S (step S8). When it is determined in step S8 that the evaluation index has not been derived, the control apparatus 100 determines a new irradiation region so that the light-emitting element before deriving the evaluation index is included (step S9). Thereafter, processing from step S2 is performed again.

When it is determined in step S8 that the evaluation index has been derived for all the light-emitting elements, the control apparatus 100 compares the evaluation index of each light-emitting element with a predetermined threshold value, and identifies a defective product (defective pixel) (step S10). Specifically, the control apparatus 100 sorts (rearranges) the light-emitting elements in descending order of the evaluation indices, and determines that a light-emitting element having an evaluation index equal to or higher than the threshold value is a non-defective product (non-defective pixel), and a light-emitting element having an evaluation index smaller than the threshold value is a defective product (defective pixel).

Subsequently, the control apparatus 100 derives the center of gravity (center wavelength) of the fluorescence wavelength from the ratio of the luminance on the short wavelength side to the luminance on the long wavelength side for each light-emitting element determined to be a non-defective product in step S10 (step S11). In deriving the center wavelength, the control apparatus 100 may derive Δλ, which is the shift amount of the center wavelength, further considering a change rate of the transmittance or the reflectance with respect to the change of the wavelength in the dichroic mirror 60, specifically using the above Equation (14), and derive a precise center wavelength for each light-emitting element by correcting (subtracting) the shift amount Δλ with respect to the previously derived center wavelength.

Finally, the control apparatus 100 determines whether or not the center wavelength is within the specified wavelength range, so that a light-emitting element not within the specified wavelength range is set to a defective product (defective pixel), and each light-emitting element within the specified wavelength range is classified into grades for each predetermined wavelength range, and derives color irregularity information between a plurality of light-emitting elements based on the grades (step S12). The control apparatus 100 may determine the quality of each light-emitting element and the sample S based on the color irregularity information.

Next, actions and effects of the present embodiment will be described.

A description will be given of the actions and effects of the inspection apparatus 1 according to the present embodiment.

The inspection apparatus 1 according to the present embodiment is an inspection apparatus for inspecting the sample S in which the plurality of light-emitting elements is formed, and includes the excitation light source 20 that generates excitation light to irradiate the sample S, the optical element (dichroic mirror 60) that separates fluorescence from the sample S by transmitting or reflecting the fluorescence according to the wavelength, the camera 81 that images fluorescence reflected by the dichroic mirror 60, the camera 82 that images fluorescence transmitted through the dichroic mirror 60, and the control apparatus 100 that derives the color irregularity information of the light-emitting element based on the first fluorescence image acquired by the camera 81 and the second fluorescence image acquired by the camera 82, and the edge shift width WE corresponding to the width of the wavelength band in which transmittance and reflectance change according to the change in wavelength in the dichroic mirror 60 is wider than the full width at half maximum WH of the normal fluorescence spectrum ES of the light-emitting element (see FIG. 2).

In the inspection apparatus 1, the edge shift width corresponding to the width of the wavelength band in which transmittance and reflectance change according to the change in wavelength in the dichroic mirror 60 is wider than the full width at half maximum of the normal fluorescence spectrum of the light-emitting element. For example, when an optical element having a narrow edge shift width is used, it is considered that fluorescence having a narrow wavelength width cannot be appropriately separated. It is presumed that the wavelength width of the normal fluorescence spectrum of the light-emitting element is 5 nm and the edge shift width of the optical element is 5 nm. At this time, the transmission wavelength and the reflection wavelength change only in a range of 15 nm, and even when the wavelength of the normal fluorescence spectrum is shifted beyond this range, the transmittance or reflectance is only 100%, and it is not possible to obtain information about the amount of change of the wavelength. Further, the amount of change in the ratio of the reflected light to the transmitted light increases as a luminance peak of the normal fluorescence spectrum approaches the center wavelength of the edge shift width, and decreases as the luminance peak is away from the center wavelength. That is, this change amount largely depends on the spectral shape of the emission wavelength. The actual light-emitting element may have a plurality of peaks instead of simple light emission (for example, a spectrum of Gaussian distribution). As described above, when an optical element having a narrow edge shift width is used, it is almost impossible to accurately estimate the amount of change in wavelength. In this regard, by using the dichroic mirror 60 in which the edge shift width is wider than the full width at half maximum of the normal fluorescence spectrum, that is, sufficiently wider than a wavelength width of fluorescence in consideration of the wavelength width as in the inspection apparatus 1 according to the present embodiment, it is possible to easily separate the fluorescence according to the wavelength. In this way, it is possible to derive color irregularity information with high accuracy from the first fluorescence image and the second fluorescence image based on each part of the fluorescence separated according to the wavelength.

Further, in the present embodiment, the edge shift width of the dichroic mirror 60 is set to 150 nm or less. When the edge shift width is excessively widened, the resolution of the dichroic mirror is lowered, which may affect an original function of the dichroic mirror for separating fluorescence into a short wavelength side and a long wavelength side. In this regard, by setting the edge shift width to be wider than the full width at half maximum of the normal fluorescence spectrum and less than or equal to 150 nm, the fluorescence can be easily separated into the short wavelength side and the long wavelength side while dealing with fluorescence having a narrow wavelength width.

As described above, in the present embodiment, by using the dichroic mirror 60 as the optical element, fluorescence can be easily separated according to the wavelength.

The control apparatus 100 may derive color irregularity information of the light-emitting element by further considering the change rate of the transmittance or the reflectance with respect to the change of the wavelength in the dichroic mirror 60. The color irregularity information is derived in consideration of, for example, the ratio of the luminance of each separated fluorescent image, etc. When a dichroic mirror 60 having a wide edge shift width is used, transmittance and reflectance change according to a change in wavelength, and thus it is conceivable that the luminance ratio of each fluorescent image is different from that when a normal dichroic mirror (an optical element having a narrow edge shift width) is used. In this regard, by deriving the color irregularity information in consideration of the change rate of the transmittance or the reflectance with respect to the change of the wavelength in the dichroic mirror 60, the color irregularity information can be derived with high accuracy by removing the influence of using the dichroic mirror 60 having the wide edge shift width.

The control apparatus 100 derives color irregularity information between a plurality of light-emitting elements. In this way, it is possible to output the color irregularity information in units of samples S, and to determine, for example, the quality of each light-emitting element based on the color irregularity information.

Even though the present embodiment has been described above, the invention is not limited to the above embodiment. For example, even though a description has been given on the assumption that the dichroic mirrors 40 and 60 are used as the optical elements, the invention is not limited thereto. For example, it is possible to use a component in which a half mirror, a short pass filter, a long pass filter, etc. are combined, as the optical element. Further, for example, it is possible to use a component in which a half mirror and a dichroic filter having a wide edge displacement width are combined, as the optical element. In this case, for example, the dichroic mirror 60 having the wide edge shift width can include a half mirror and a dichroic filter having a wide edge displacement width arranged on the side of the cameras 81 and 82.

In addition, even though a description has been given on the assumption that the control apparatus 100 derives the color irregularity information between the plurality of light-emitting elements, the invention is not limited thereto. The control apparatus 100 may derive the color irregularity information in each light-emitting element. In this case, the control apparatus 100 can output the color irregularity information in units of light-emitting elements, and identify an abnormal portion, etc. in each light-emitting element based on the color irregularity information.

Next, as a further embodiment of the invention, a description will be given of wavelength shift correction according to a position in a field of view (see FIG. 6), illumination luminance adjustment of excitation light (see FIGS. 7 to 10), and determination of the quality of the light-emitting element according to wavelength variation (fluctuation) (see FIGS. 11A and 11B).

(Wavelength Shift Correction According to Position in Field of View)

Figure 6:
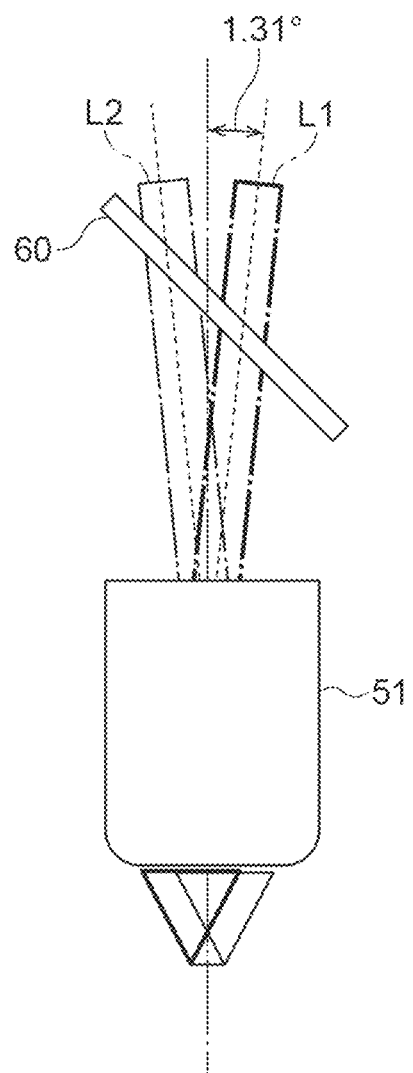
FIG. 6 is a diagram for description of a difference in incident angle according to the position in a field of view.

FIG. 6 is a diagram for description of a difference in incident angle according to a position in a field of view in the cameras 81 and 82. FIG. 6 illustrates an objective lens 51 that guides the fluorescence from the sample S in a direction of a dichroic mirror 60, and the dichroic mirror 60. Note that it is presumed that the objective lens 51 and the dichroic mirror 60 here have the same configuration as that of the objective lens 51 and the dichroic mirror 60 illustrated in FIG. 1 and have the same positional relationship. Here, in general, when the objective lens 51 corrected to infinity is used, light (fluorescence) emitted from one point of the sample S becomes parallel light after passing through the objective lens 51, which holds at each point (each pixel) in the field of view of the cameras 81 and 82. However, even though luminous fluxes are parallel at each point, luminous fluxes at different points are not parallel. Therefore, an angle of light incident on the dichroic mirror 60 differs depending on the point (pixel) in the field of view of the cameras 81 and 82 from which the light comes. Further, an optical characteristic of the dichroic mirror 60 changes depending on the incident angle of the fluorescence. That is, in the dichroic mirror 60, a wavelength (center wavelength) at which the transmittance becomes 50% changes depending on the incident angle of the fluorescence (that is, the position of the pixel in the field of view).

As an example, when a size of the field of view of the cameras 81 and 82 is ±0.47 mm (0.94 mm square) and the objective lens 51 is a 10× lens, it is presumed that an angle difference is ±1.31 degrees between a luminous flux L1 on one end side and a luminous flux L2 on the other end side in the field of view illustrated in FIG. 6. When there is such an angle difference, for example, a wavelength difference between the luminous fluxes L1 and L2 becomes about ±1.8 nm if the central wavelength is about 460 nm, a wavelength difference between the luminous fluxes L1 and L2 becomes about ±2.6 nm if the central wavelength is about 520 nm, and a wavelength difference between the luminous fluxes L1 and L2 becomes about ±3.0 nm if the central wavelength is about 600 nm.

In the present embodiment, the control apparatus 100 corrects such a wavelength shift. That is, the control apparatus 100 corrects the wavelength shift according to the position in the field of view of the cameras 81 and 82 for each pixel of the fluorescence image. Specifically, the control apparatus 100 corrects the wavelength shift for each pixel based on an incident angle of fluorescence on the dichroic mirror 60 for each pixel estimated according to a position in the field of view and an optical characteristic of the dichroic mirror 60 with respect to the amount of change in wavelength according to the incident angle of the fluorescence. Since the control apparatus 100 has previously acquired a relationship between the position in the field of view and the incident angle on the optical element, and the amount of change in wavelength according to the incident angle (optical characteristic of the dichroic mirror 60), the amount of change in wavelength (shift amount) can be derived by calculation (simulation) when the position of each pixel of the fluorescence image is input. Then, the control apparatus 100 determines the amount of correction (offset) of the wavelength so as to reduce the amount of change in wavelength (wavelength shift) of each pixel.

In addition to the above-mentioned correction, the control apparatus 100 may correct the wavelength shift for each pixel so that a wavelength variance of each pixel in the field of view becomes small. A result of the above-mentioned simulation is merely a correction based on a design value. Therefore, for example, when an installation angle of the dichroic mirror 60 is shifted from the design value, the wavelength shift cannot be highly accurately corrected. Even in such a case, by correcting the wavelength shift for each pixel so that the wavelength variance of each pixel in the field of view becomes small, the wavelength in the field of view can be made similar regardless of the design value, and the wavelength shift due to the position in the field of view can be appropriately corrected. Note that the control apparatus 100 may perform only this correction without performing the correction by the simulation described above.

(Adjustment of Illumination Luminance of Excitation Light)

Next, a description will be given of adjustment of illumination luminance of excitation light. When the sample S, which is a semiconductor apparatus, is irradiated with excitation light and fluorescence is observed, broad fluorescence including a wavelength of fluorescence (abnormal fluorescence) emitted from an impurity or defective portion in the sample S is obtained. That is, in fluorescence observation, broad fluorescence including both a wavelength of original fluorescence and a wavelength of abnormal fluorescence is obtained. Here, while the abnormal fluorescence becomes stronger in almost proportion to illumination luminance of excitation light, the original fluorescence becomes stronger to about the square of the illumination luminance of the excitation light. Therefore, when the illumination luminance of the excitation light is relatively low, a difference between the luminance of the original fluorescence (original fluorescence intensity: first fluorescence intensity) and the luminance of the abnormal fluorescence (abnormal fluorescence intensity: second fluorescence intensity) is small. On the other hand, when the illumination luminance of the excitation light is relatively high, the difference between the first fluorescence intensity and the second fluorescence intensity becomes large.

Figure 7:
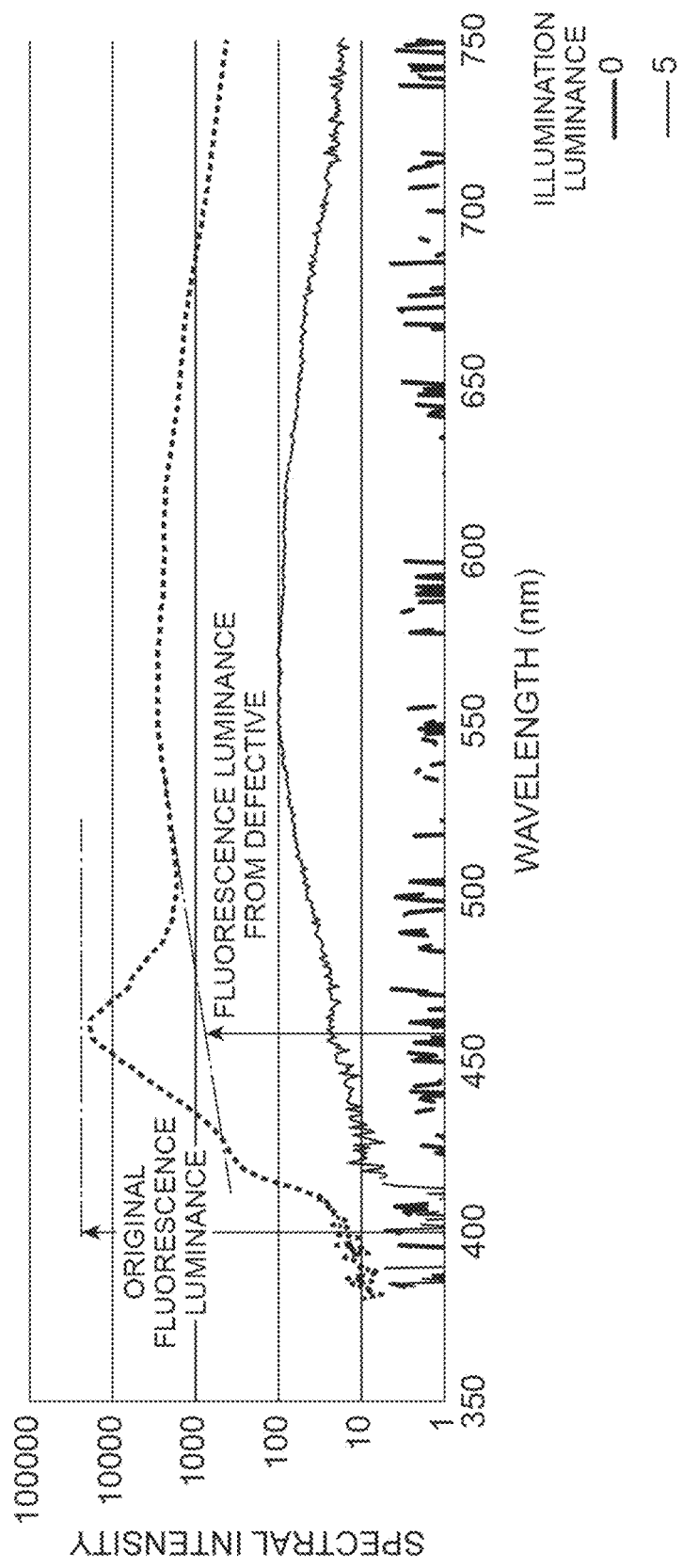
FIG. 7 is a diagram showing spectral intensity according to illumination luminance.

FIG. 7 is a diagram showing spectral intensity according to illumination luminance of excitation light. As shown in FIG. 7, when the illumination luminance is relatively low (see a graph of illumination luminance: 0 or 5 in FIG. 7), it is difficult to discriminate a difference between the first fluorescence intensity and the second fluorescence intensity from the spectral intensity. That is, under a condition where the excitation light is weak, the original fluorescence to be observed is buried in the abnormal fluorescence, making it difficult to observe. On the other hand, as shown in FIG. 7, when the illumination luminance is relatively high (see a graph of illumination luminance: 128 in FIG. 7), the first fluorescence intensity becomes sufficiently large, and thus it is possible to distinguish between the original fluorescence luminance (first fluorescence intensity) and the abnormal fluorescence luminance (second fluorescence intensity) caused by a defect, etc. from the spectral intensity. In this case, it is possible to accurately observe the emission luminance and the wavelength of the light-emitting element.

Figure 8:
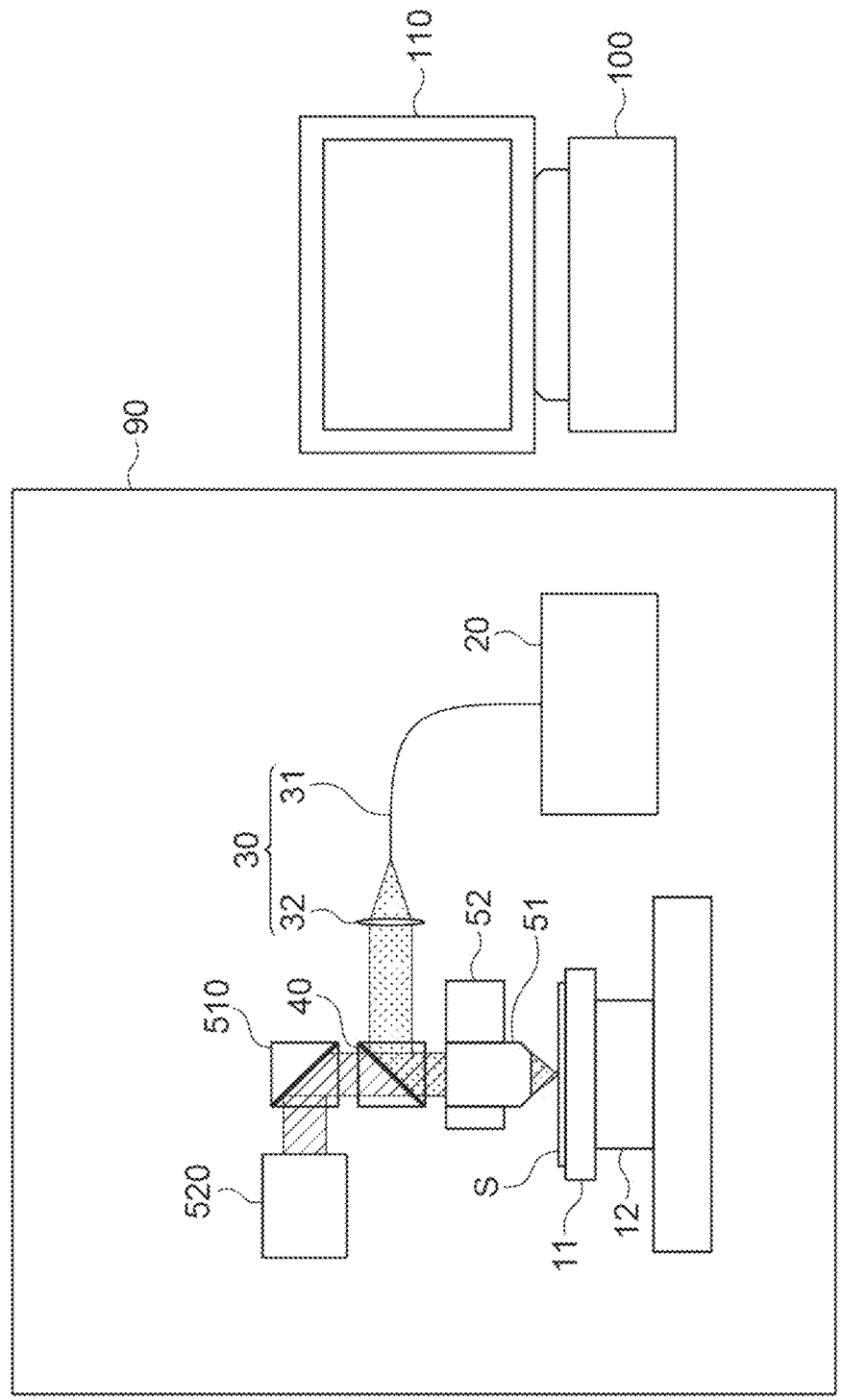
FIG. 8 is a configuration diagram of an optical system using a spectroscope.

In the present embodiment, in preprocessing performed before deriving the color irregularity information, the illumination luminance of the excitation light is adjusted so that the illumination luminance of the excitation light becomes strong enough to distinguish between the first fluorescence intensity and the second fluorescence intensity described above. Specifically, an inspection apparatus 500 illustrated in FIG. 8 adjusts the illumination luminance of the excitation light. Note that FIG. 8 illustrates only a configuration for adjusting the illumination luminance of the excitation light. However, in practice, a configuration related to derivation of the color irregularity information such as the imaging unit illustrated in FIG. 1 is provided, and the corresponding configuration may be used by switching between a process related to adjustment of the illumination luminance of the excitation light (preprocessing) and a process related to derivation of the color irregularity information.

As illustrated in FIG. 8, the inspection apparatus 500 includes a half mirror 510 and a spectroscope 520 after a dichroic mirror 40. The half mirror 510 is configured to reflect at least a part of the fluorescence from the sample S in a direction of the spectroscope 520. The spectroscope 520 decomposes fluorescence input through the half mirror 510 for each wavelength and measures a spectrum of the fluorescence (see FIG. 7).

The control apparatus 100 identifies the first fluorescence intensity, which is the original fluorescence intensity, and the second fluorescence intensity, which is the abnormal fluorescence intensity smaller than the first fluorescence intensity, based on a spectrum of the fluorescence measured by the spectroscope 520 in a process related to adjustment of the illumination luminance of the excitation light (preprocessing), and determines the illumination luminance of the excitation light applied to the sample S so that the first fluorescence intensity becomes larger than the second fluorescence intensity by a predetermined value or more. The control apparatus 100 adjusts the illumination luminance of the excitation light emitted from the excitation light source 20 so that the illumination luminance becomes stronger until, for example, the first fluorescence intensity becomes 10 times or more the second fluorescence intensity. Then, the excitation light source 20 generates excitation light having illumination luminance determined by the control apparatus 100 in a process of deriving the color irregularity information after the preprocessing.

Figure 9:
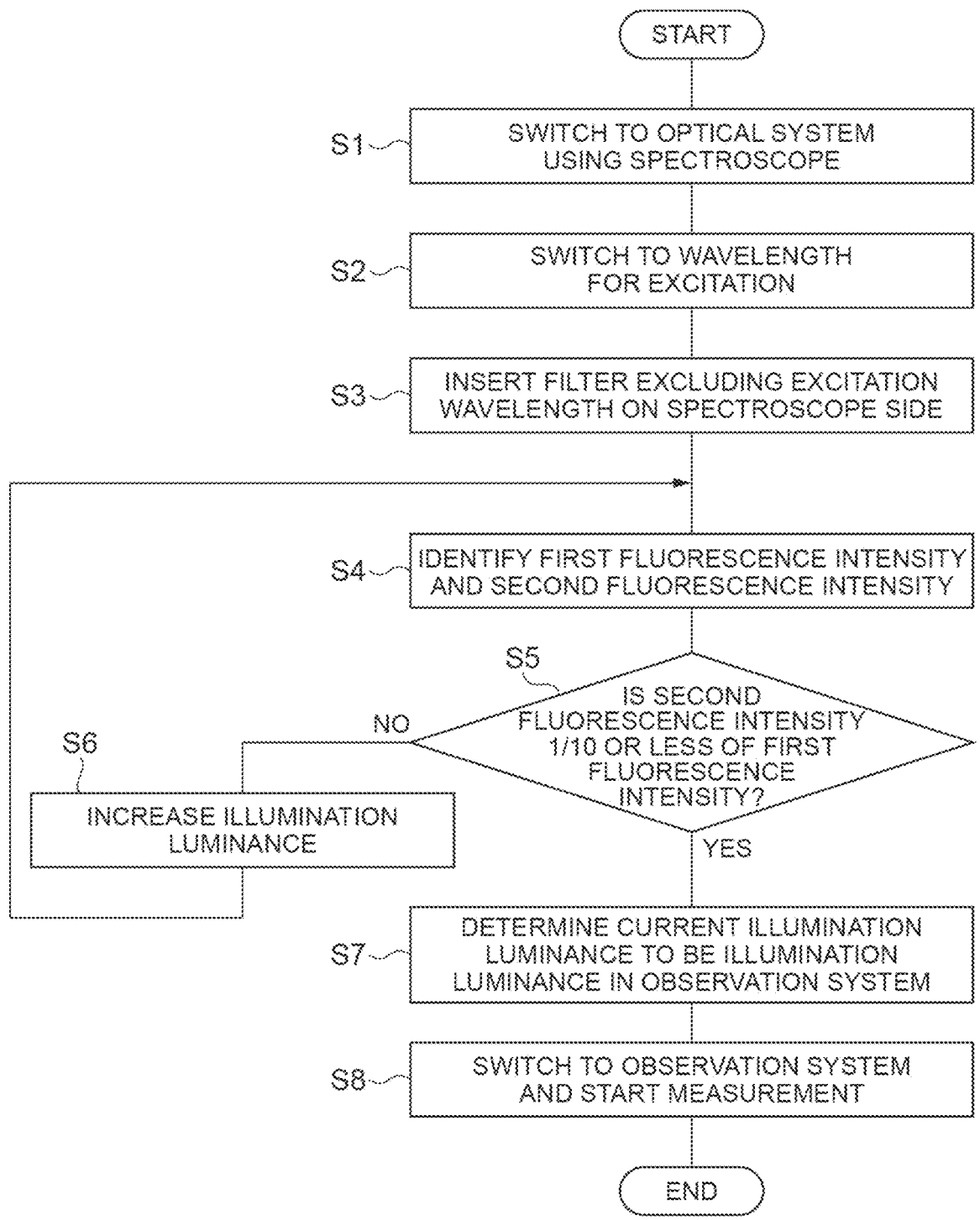
FIG. 9 is a flowchart illustrating an illumination luminance adjustment process.

FIG. 9 is a flowchart illustrating an illumination luminance adjustment process by the control apparatus 100. Note that an inspector may execute a part of processing to be performed by the control apparatus 100 in the following description. As illustrated in FIG. 9, the control apparatus 100 switches a configuration of the inspection apparatus 500 to a configuration using the spectroscope 520 (configuration for performing the preprocessing) illustrated in FIG. 8 (step S1), and switches a wavelength of excitation light to a wavelength for excitation (step S2). Note that the control apparatus 100 may insert a band-pass filter instead of switching the wavelength of the excitation light.

Subsequently, the control apparatus 100 inserts a filter excluding an excitation wavelength in front of the spectroscope 520 (step S3). Then, the control apparatus 100 identifies the first fluorescence intensity and the second fluorescence intensity based on the fluorescence spectrum measured by the spectroscope 520 (step S4). The control apparatus 100 determines whether the second fluorescence intensity is $1/10$ or less of the first fluorescence intensity (whether the first fluorescence intensity is 10 times or more the second fluorescence intensity) (step S5).

When it is determined in step S5 that the second fluorescence intensity is not $1/10$ or less of the first fluorescence intensity, the control apparatus 100 increases the illumination luminance of the excitation light emitted from the excitation light source 20 by a predetermined value (step S6), and processing of step S4 and subsequent steps is performed again. In this way, the process of changing (intensifying) the illumination luminance is repeatedly performed until it is determined in step S5 that the second fluorescence intensity is $1/10$ or less of the first fluorescence intensity.

When it is determined in step S5 that the second fluorescence intensity is $1/10$ or less of the first fluorescence intensity, the control apparatus 100 determines the illumination luminance at that time to be illumination luminance in an observation system (process for deriving color irregularity information) (step S7). Then, the control apparatus 100 switches the configuration of the inspection apparatus 500 to a configuration of the observation system (process for deriving the color irregularity information), and starts the process for deriving the color irregularity information (step S8).

Note that when excitation light of the determined illumination luminance is generated by the excitation light source 20, and fluorescence is imaged by the cameras 81 and 82 (see FIG. 1), so that the amount of incident light on at least one of the cameras 81 and 82 is saturated, the control apparatus 100 may insert a filter that limits the amount of light in front of the saturated cameras 81 and 82.

Figure 10:
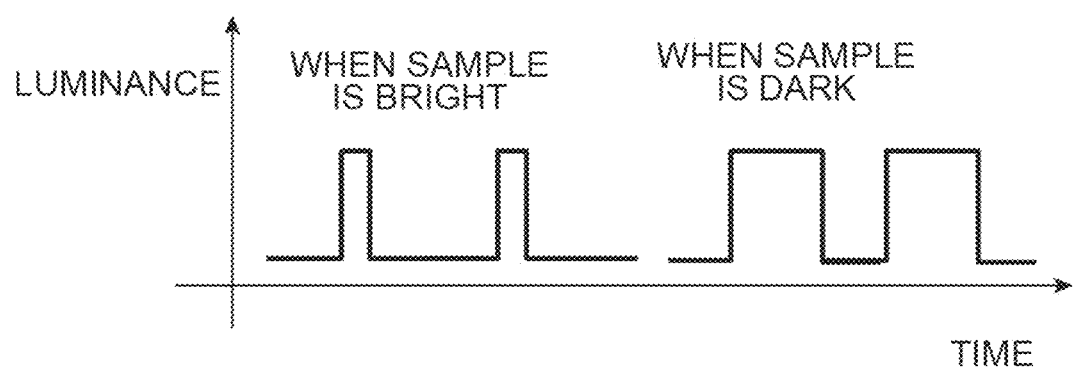
FIG. 10 is a diagram for description of adjustment of a duty ratio.

Further, when the excitation light source 20 generates and irradiates excitation light which is pulsed light, the control apparatus 100 may suppress the amount of incident light on the cameras 81 and 82 by adjusting the duty ratio of the pulsed light, and avoid the saturation of the cameras 81 and 82 described above. That is, as shown in FIG. 10, the control apparatus 100 may shorten an incident time of the fluorescence on the cameras 81 and 82 by decreasing the duty ratio of the pulsed light when the illumination luminance of the excitation light is high (sample S is bright) enough to saturate the cameras 81 and 82 when compared to a case where the illumination luminance of the excitation light is low enough that saturation of the cameras 81 and 82 is not an issue (sample S is dark), and suppress the amount of incident without changing the fluorescence intensity. Note that it is preferable that the excitation light source 20 synchronizes a frequency of the pulsed light with an integral multiple of the reciprocal of an exposure time of the cameras 81 and 82 under the control of the control apparatus 100, thereby making the number of rays of pulsed light included in each exposure time the same and unifying the amount of incident light of fluorescence in each exposure time.

Further, in the above-mentioned preprocessing, the control apparatus 100 may perform a process of multiplying a signal of only abnormal fluorescence when the illumination luminance is low by an integer and removing only a spectrum of the abnormal fluorescence from a signal spectrum when the illumination luminance is high.

(Determination of Quality of Light-Emitting Element According to Variation of Wavelength)

Next, a description will be given of a method of determining the quality of the light-emitting element according to a variation in wavelength. In this method, the inventors focus on the fact that "the center of gravity (center wavelength) of the fluorescence wavelength of each light-emitting element in the sample S tends to fluctuate (vary in a luminance band corresponding to a defective product", and the quality is determined according to the variation in the center of gravity of the fluorescence wavelength. It is considered that such variation is caused by the tendency of fluorescence to shift in the long wavelength direction since impurities and leak currents cause a voltage to drop and the amount of energy to decrease in a defective product.

Figures 11A, 11B:
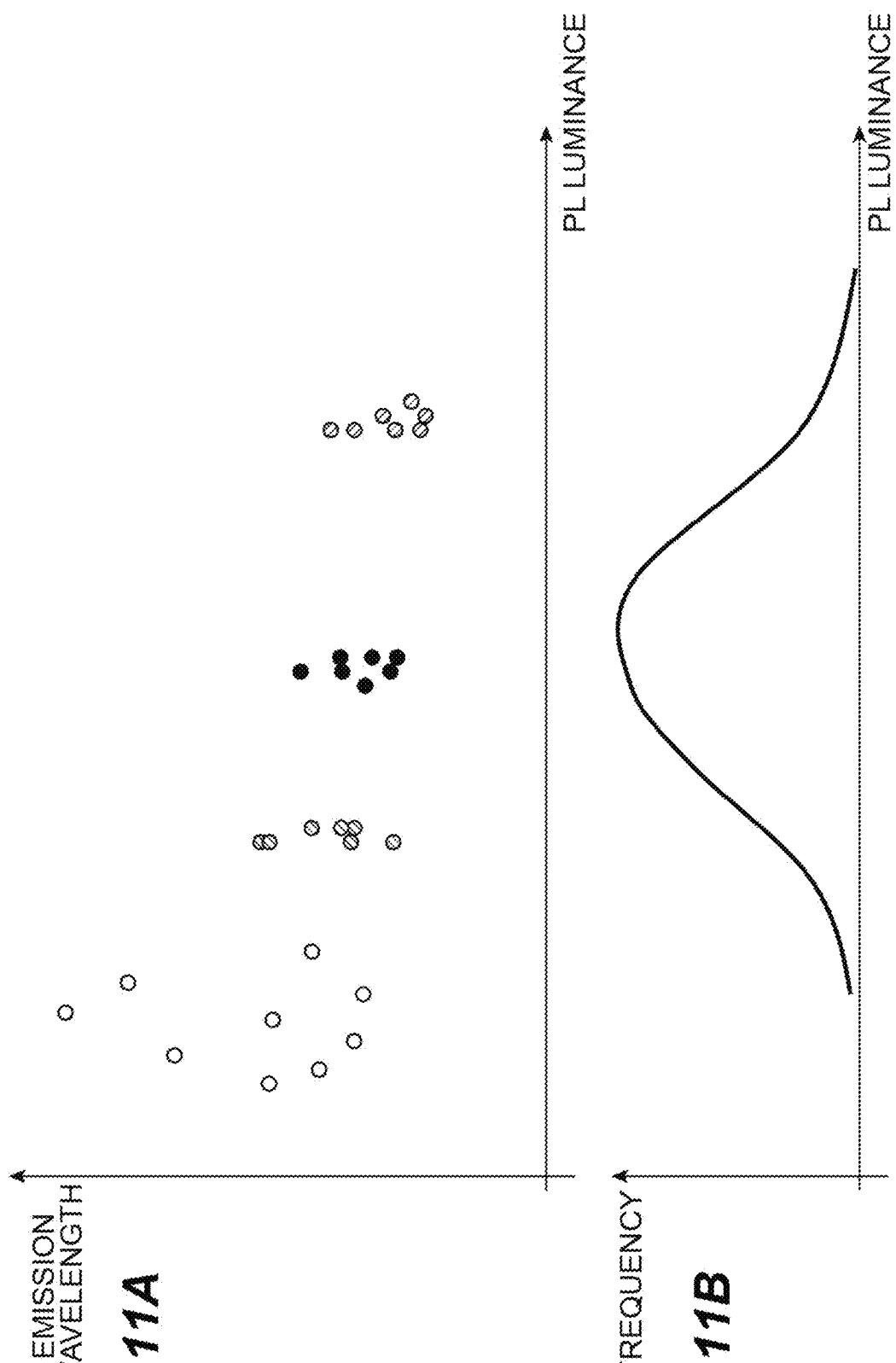
FIGS. 11A and 11B are diagrams for description of determination of a quality of a light-emitting element according to a variation in a center of gravity of a fluorescence wavelength.

FIGS. 11A and 11B are diagrams for description of determination of the quality of the light-emitting element according to the variation in the center of gravity of the fluorescence wavelength. FIGS. 11A and 11B show an example of a result when all the light-emitting elements of the sample S are sorted (rearranged) in the order of PL luminance (fluorescence luminance). In FIG. 11A, a horizontal axis represents the fluorescence luminance, and a vertical axis represents the center of gravity of the emission (fluorescence) wavelength. In FIG. 11A, a circle represents a result of each light-emitting element. Further, in FIG. 11B, a horizontal axis represents the fluorescence luminance, and a vertical axis represents the number (frequency) of light-emitting elements. As shown in FIG. 11B, the number (frequency) of light-emitting elements is peak in a certain luminance band and the number (frequency) of light-emitting elements gradually decreases in each of a direction in which the luminance increases and a direction in which the luminance decreases. Further, as shown in FIG. 11A, while the variation in the fluorescence wavelength of the light-emitting element is small in a luminance band where the luminance is relatively high (non-defective product), the variation in the fluorescence wavelength of the light-emitting element becomes large in a luminance band where the luminance is relatively low (defective product). The control apparatus 100 determines that a light-emitting element in a luminance band having a large variation is a defective product.

That is, the control apparatus 100 derives the luminance of each light-emitting element and the center of gravity of the fluorescence wavelength based on the fluorescence image on the short wavelength side (first fluorescence image) and the fluorescence image on the long wavelength side (second fluorescence image). Then, the control apparatus 100 sorts the light-emitting elements in order of luminance, and determines that a light-emitting element in a luminance band where a variation in fluorescence wavelength is larger than a predetermined value is a defective product, and a light-emitting element in a luminance band where a variation in fluorescence wavelength is equal to or less than the predetermined value is a non-defective product. After sorting, for example, the control apparatus 100 derives the fluctuation (standard deviation) of the fluorescence wavelength for every certain number of products (for example, every ten products) from a defective product side (side where the luminance is small), and determines that luminance at which the fluctuation converges to a predetermined value or less is a threshold value of the non-defective product/defective product.

Note that when the center of gravity of the fluorescence wavelength is derived from measurement results (fluorescence images) by the two cameras 81 and 82, the control apparatus 100 may perform correction in consideration of a measurement result (result obtained in the preprocessing) of the spectroscope 520 described above. As a result, the center of gravity of the fluorescence wavelength can be derived with higher accuracy.

Finally, actions and effects of each aspect described as a further embodiment will be described.

The control apparatus 100 may correct the wavelength shift according to the position in the field of view of the cameras 81 and 82 for each pixel of the fluorescence image. The angle of the light incident on the dichroic mirror 60 from the sample S differs depending on the position in the field of view of the cameras 81 and 82. Further, a difference in incident angle on the dichroic mirror 60 causes a difference (wavelength shift) in the center of gravity (center wavelength) of the fluorescence wavelength. That is, a difference (wavelength shift) in center wavelength of fluorescence related to each pixel is caused depending on the position in the field of view. In this regard, as described above, by correcting the wavelength shift according to the position in the field of view of the cameras 81 and 82, it is possible to suppress the wavelength shift caused by the position in the field of view and to appropriately acquire the original fluorescence related to each pixel.

The control apparatus 100 may correct the wavelength shift for each pixel based on the incident angle of the fluorescence on the dichroic mirror 60 for each pixel estimated according to the position in the field of view, and the optical characteristic of the dichroic mirror 60 with respect to the amount of change in wavelength according to the incident angle of the fluorescence. When the relationship between the position in the field of view and the incident angle on the dichroic mirror 60 and the amount of change in wavelength according to the incident angle are identified in advance, the amount of change in wavelength for the pixel can be derived from the position in the field of view. Thus, the wavelength shift can be easily and appropriately corrected for each pixel.

The control apparatus 100 may correct the wavelength shift for each pixel so that the wavelength variance of each pixel in the field of view becomes small. As a result, the variation in the central wavelength of the fluorescence related to each pixel in the field of view is suppressed, and thus the wavelength shift due to the position in the field of view can be appropriately corrected.

The inspection apparatus 500 further includes the spectroscope 520 that decomposes fluorescence for each wavelength and measures the spectrum, the control apparatus 100 may identify the first fluorescence intensity, which is the original fluorescence intensity, and the second fluorescence intensity, which is an abnormal fluorescence intensity smaller than the first fluorescence intensity, based on the spectrum in the preprocessing performed before deriving the color irregularity information, and determine the illumination luminance of the excitation light applied to the sample S so that the first fluorescence intensity becomes larger than the second fluorescence intensity by a predetermined value or more, and the excitation light source 20 may generate excitation light of the illumination luminance determined by the control apparatus 100. The original fluorescence has a larger rate of increase when the illumination luminance of the excitation light becomes higher comparing to the abnormal fluorescence caused by impurities or defects. That is, when the illumination luminance of the excitation light is low, a difference in intensity between the original fluorescence and the abnormal fluorescence is small and there is concern that the original fluorescence may be buried in the abnormal fluorescence. On the other hand, when the illumination luminance of the excitation light is high, the difference in intensity between the original fluorescence and the abnormal fluorescence becomes large, and the original fluorescence is inhibited from being buried in the abnormal fluorescence. As described above, in the preprocessing, when the illumination luminance of the excitation light is determined so that the first fluorescence intensity, which is the original fluorescence intensity, is sufficiently larger than the second fluorescence intensity, which is the abnormal fluorescence intensity, the illumination luminance of the excitation light can be determined so that the original fluorescence is not buried, and the color irregularity information can be accurately derived.

When the excitation light of the determined illumination luminance is generated by the excitation light source 20 and the fluorescence is imaged by the cameras 81 and 82, so that the amount of incident light on at least one of the cameras 81 and 82 is saturated, the control apparatus 100 may insert a filter that limits the amount of light in front of the saturated cameras 81 and 82. As a result, it is possible to appropriately prevent the cameras 81 and 82 from being saturated even when the illumination luminance of the excitation light is increased.

The excitation light source 20 may generate excitation light which is pulsed light. By irradiating the pulsed light, both the original fluorescence and the abnormal fluorescence are compared at the peak luminance at all times, and thus it is possible to easily and reliably determine whether the first fluorescence intensity is sufficiently larger than the second fluorescence intensity.

When the excitation light of the determined illumination luminance is generated by the excitation light source 20 and the fluorescence is imaged by the cameras 81 and 82, so that the amount of incident light on at least one of the cameras 81 and 82 is saturated, the control apparatus 100 may suppress the amount of incident light by adjusting the duty ratio of the pulsed light. The cameras 81 and 82 can be saturated by the amount of incident light, that is, the intensity of fluorescence X time, and thus by changing the duty ratio of the pulsed light to adjust the incident time of the fluorescence, saturation of the cameras 81 and 82 can be appropriately suppressed without changing the fluorescence intensity (ratio of original fluorescence to abnormal fluorescence).

The excitation light source 20 may synchronize the frequency of the pulsed light with an integral multiple of the reciprocal of the exposure time of the cameras 81 and 82. As a result, the number of rays of the pulsed light included in each exposure time can be made the same, and it is possible to prevent the amount of incident light of the fluorescence from being different between exposure times.

The control apparatus 100 may derive the luminance of each light-emitting element and the center of gravity of the fluorescence wavelength based on the fluorescence image on the short wavelength side (first fluorescence image) and the fluorescence image on the long wavelength side (second fluorescence image), and determine that a light-emitting element having a luminance at which a variation in the center of gravity of the fluorescence wavelength becomes larger than a predetermined value is a defective product and a light-emitting element having a luminance at which the variation in the center of gravity of the fluorescence wavelength becomes less than or equal to the predetermined value is a non-defective product. The center of gravity (center wavelength) of the fluorescence wavelength tends to fluctuate (tends to vary) in a luminance band of a defective product. Therefore, by determining that a light-emitting element having a luminance (luminance band) at which the variation in the center of gravity of the fluorescence wavelength is larger than the predetermined value is a defective product, it is possible to highly accurately and easily determine whether a product is defective/non-defective.

It is known that an emission wavelength of an LED depends on the temperature of the apparatus. Therefore, it is desirable that the chuck 11 is black in order to eliminate an influence of a change in the illumination intensity due to reflection of illumination light. However, when the chuck 11 is black, there is concern that a sample temperature may drift due to illumination, and an emission wavelength may drift. In order to prevent this concern, it is preferable that the chuck 11 which is a portion for adsorbing the sample S is provided with a mechanism (temperature control function) for controlling the temperature. Alternatively, it is preferable that the chuck 11 sucks only a peripheral portion of the sample S and holds the sample S in a state where a bottom of the sample S is floating. In this way, it is possible to prevent a shift in the measurement wavelength due to a temperature change. Further, measurement may be performed in a state where the temperature of the sample S is intentionally raised by using the above temperature control function. It is known that the amount of leakage current in a crystal defect of sample S is strongly influenced by temperature. Therefore, by heating the sample S, it is possible to increase an influence of a decrease in luminance and a wavelength shift due to a leakage from a defect.

It is known that the emission intensity of the LED is not the first order of the illumination intensity, but becomes stronger in proportion to the order higher than that, which is likely to be different for each process of the sample S. Further, the illumination luminance may need to be changed accordingly. Further, a luminance distribution of illumination applied to the sample S cannot be completely flat. That is, the PL luminance may have different shading for each sample S in a screen. To prevent this, it is preferable to change the shading of the fluorescent image at least each time a apparatus of a different process is measured. Further, it is more preferable to obtain the shading of the fluorescence image from an actual sample for each sample S and each time the intensity of the illumination light is changed. That is, the control apparatus 100 (processing unit) may change the shading of the fluorescence image each time the sample S and the illumination luminance of the excitation light are changed.

A leak current may be generated in a defective LED, and when the illumination luminance of the excitation light for such an LED is comparable to the leak current, the fluorescence luminance is greatly affected by this leak current. It is known that when a fluorescence image is acquired with an illumination luminance at which a light current near a leak current, which is a criterion for determining a defect, flows and an illumination luminance stronger than that, the amount of change in the fluorescence luminance becomes large. Therefore, it is preferable to acquire fluorescence data while switching the illumination luminance of the excitation light source for obtaining the fluorescence a plurality of times. For example, when the amount of increase in fluorescence luminance as a result of exposure for 10 ms at a luminance 1 and a result of exposure for 1 ms at a luminance 10 is evaluated, a product having an abnormally large amount of increase or a product having no increase at all may be determined to be defective. In this way, the excitation light source 20 may switch the illumination luminance of the excitation light a plurality of times.

The inspection apparatus 1 may have a function of observing a shape of each light-emitting element formed on the sample S in addition to a function of inspecting light emission from the sample S. When measuring the shape (pattern) of each light-emitting element, it is possible to use illumination having a wavelength longer than the emitting wavelength of each light-emitting element observed in light emission. As a result, it is possible to satisfactorily observe a shape of an electrode, etc. behind a light-emitting layer of each light-emitting element.

REFERENCE SIGNS LIST

1: inspection apparatus, 11: chuck (holding member), 20: excitation light source, 81: camera (first imaging unit), 82: camera (second imaging unit), 100: control apparatus (processing unit), S: sample (object).

The invention claimed is:

1. An inspection method for inspecting a plurality of light-emitting elements, the method comprising:
separating fluorescence from the light-emitting elements by transmitting and reflecting the fluorescence according to a wavelength by an optical element having monotonically increasing proportions of transmittance and reflectance relative to the wavelength at a predetermined wavelength range, and detecting a reflected light amount of fluorescence reflected by the optical element and a transmitted light amount of fluorescence transmitted through the optical element; and
deriving a shift amount in a central wavelength being a value obtained by dividing a wavelength shift parameter, which is a value obtained by dividing a difference between the transmitted light amount and the reflected light amount by a total light amount, by twice a change amount in the transmitted light amount in the optical element, and subtracting the shift amount from a previously-derived central wavelength of the fluorescence emitted from the light-emitting elements so as to derive a final central wavelength.

2. The inspection method according to claim 1, wherein the shift amount from the wavelength of the light-emitting elements in which the ratio of transmittance or reflectance becomes 50% in the optical element is derived based on a ratio of transmittance and reflectance, and the central wavelength of the light-emitting elements is derived from the wavelength of the optical element and the shift amount.

3. The inspection method according to claim 1, wherein the central wavelength of fluorescence among the light-emitting elements is derived.

4. The inspection method according to claim 3, wherein the shift amount for each pixel is corrected based on an incident angle of the fluorescence on the optical element for each pixel estimated according to a position in a field of view and based on an optical characteristic of the optical element with respect to the change amount in the wavelength according to the incident angle of the fluorescence.

5. The inspection method according to claim 3, wherein the shift amount for each pixel is corrected so as to reduce variation in the wavelength of each pixel in the field of view.

6. The inspection method according to claim 1, wherein luminance of each of the light-emitting elements is derived based on the reflected light amount and the transmitted light amount,
any of the light-emitting elements with luminance in which deviation in the central wavelength becomes greater than a predetermined value is determined as being a defective product, and
any of the light-emitting elements with luminance in which deviation in the central wavelength becomes equal to or less than the predetermined value is determined as being a non-defective product.

7. An inspection apparatus for inspecting light-emitting elements, the inspection apparatus comprising:
an excitation light source that generates excitation light to irradiate the light-emitting elements;
an optical element that separates fluorescence from the light-emitting elements by transmitting and reflecting the fluorescence according to a wavelength, the optical element having monotonically increasing proportions of transmittance and reflectance relative to the wavelength at a predetermined wavelength range;
a first sensor that detects a reflected light amount from fluorescence reflected by the optical element;
a second sensor that detects a transmitted light amount from fluorescence transmitted through the optical element; and
a processor that derives that derives a shift amount in a central wavelength being a value obtained by dividing a wavelength shift parameter, which is a value obtained by dividing a difference between the transmitted light amount and the reflected light amount by a total light amount, by twice a change amount in the transmitted light amount in the optical element, and subtracts the shift amount from a previously-derived central wavelength of the fluorescence emitted from the light-emitting elements so as to derive a final central wavelength.

8. The inspection apparatus according to claim 7, wherein the processor derives the shift amount from the wavelength of the light-emitting elements in which the ratio of transmittance or reflectance becomes 50% in the optical element based on a ratio of transmittance and reflectance, and derives the central wavelength of the light-emitting elements from the wavelength of the optical element and the shift amount.

9. The inspection apparatus according to claim 8, wherein the optical element is a dichroic mirror.

10. The inspection apparatus according to claim 7, wherein the edge shift width of the optical element is 150 nm or less, the edge shift width corresponding to a width of a wavelength band in which transmittance and reflectance change according to a change in wavelength.

11. The inspection apparatus according to claim 7, further comprising
a spectroscope configured to decompose the fluorescence for each wavelength and measures a spectrum,
wherein the processor identifies a first fluorescence intensity, which is an original fluorescence intensity, and a second fluorescence intensity, which is an abnormal fluorescence intensity smaller than the first fluorescence intensity, based on the spectrum in preprocessing performed before deriving the color irregularity information, and determines an illumination luminance of the excitation light applied to the object so that the first fluorescence intensity becomes larger than the second fluorescence intensity by a predetermined value or more, and
the excitation light source generates the excitation light of the illumination luminance determined by the processor.

12. The inspection apparatus according to claim 11, wherein when the excitation light of the determined illumination luminance is generated by the excitation light source, and fluorescence is imaged by the first sensor and the second sensor, so that an amount of incident light on at least one of the first sensor and the second sensor is saturated, the processor inserts a filter that limits an amount of light in front of the saturated sensor.

13. The inspection apparatus according to claim 11, wherein the excitation light source generates the excitation light which is pulsed light.

14. The inspection apparatus according to claim 13, wherein when the excitation light of the determined illumination luminance is generated by the excitation light source and fluorescence is imaged by the first sensor and the second sensor, so that an amount of incident light on at least one of the first sensor and the second sensor is saturated, the processor suppresses the amount of incident light by adjusting a duty ratio of the pulsed light.

15. The inspection apparatus according to claim 13, wherein the excitation light source synchronizes a frequency of the pulsed light with an integral multiple of a reciprocal of an exposure time of the first sensor and the second sensor.

16. The inspection apparatus according to claim 7, further comprising
a holding member that holds the object,
wherein the holding member has a temperature control function.

17. The inspection apparatus according to claim 7, further comprising
a holding member configured to hold the object,
wherein the holding member sucks exclusively a peripheral portion of the object.

18. The inspection apparatus according to claim 7, wherein the excitation light source switches the illumination luminance of the excitation light a plurality of times.

* * * * *